United States Patent
Hwang

(12) 
(10) Patent No.: US 10,210,921 B1
(45) Date of Patent: Feb. 19, 2019

(54) NON-VOLATILE FERROELECTRIC MEMORY DEVICE AND METHOD OF DRIVING THE SAME

(71) Applicant: Seoul National University R & DB foundation, Seoul (KR)

(72) Inventor: Cheol Seong Hwang, Seoul (KR)

(73) Assignee: Seoul National University RDB foundation, Seoul (KR)

( * ) Notice: Subject to any disclaimer, the term of this patent is extended or adjusted under 35 U.S.C. 154(b) by 0 days.

(21) Appl. No.: 15/903,216

(22) Filed: Feb. 23, 2018

(30) Foreign Application Priority Data

Feb. 23, 2018 (KR) .................. 10-2018-0021678

(51) Int. Cl.
*G11C 11/22* (2006.01)
*H01L 27/11502* (2017.01)

(52) U.S. Cl.
CPC ........ *G11C 11/2259* (2013.01); *G11C 11/221* (2013.01); *G11C 11/2255* (2013.01); *G11C 11/2257* (2013.01); *G11C 11/2273* (2013.01); *G11C 11/2275* (2013.01); *H01L 27/11502* (2013.01)

(58) Field of Classification Search
CPC . G11C 16/10; G11C 16/0466; G11C 11/5671; G11C 11/5628
See application file for complete search history.

(56) References Cited

U.S. PATENT DOCUMENTS

| | | | | |
|---|---|---|---|---|
| 5,198,384 | A * | 3/1993 | Dennison | H01L 27/10852 257/E21.009 |
| 5,536,672 | A * | 7/1996 | Miller | H01L 27/11502 257/E27.104 |
| 7,221,586 | B2 * | 5/2007 | Forbes | G11C 11/5671 365/185.03 |
| 7,649,763 | B2 * | 1/2010 | Takashima | G11C 11/22 365/145 |
| 10,068,912 | B1 * | 9/2018 | Singh | H01L 27/11568 |
| 10,090,036 | B2 * | 10/2018 | Van Houdt | G11C 11/223 |

* cited by examiner

*Primary Examiner* — Tuan T Nguyen

(57) ABSTRACT

The present invention relates to a non-volatile ferroelectric memory device including a semiconductor active layer, a plurality of memory cells connected in series on the semiconductor active layer, and a control circuit for performing a read operation and a program operation on the selected memory cell among the plurality of memory cells, each of the memory cells comprising a para-dielectric layer on the semiconductor active layer; a dielectric stack including a ferroelectric layer stacked on the para-dielectric layer and a charge trap site for generating a negative capacitance effect of the ferroelectric layer by charges disposed and trapped at an interface between the ferroelectric layer and the para-dielectric layer; and a control gate electrode on the ferroelectric layer.

19 Claims, 18 Drawing Sheets

Off state

On state

Off state

On state

Off state

On state

1

NON-VOLATILE FERROELECTRIC MEMORY DEVICE AND METHOD OF DRIVING THE SAME

CROSS-REFERENCE TO RELATED APPLICATION

This application claims priority of Korean Patent Application No. 10-2018-0021678, filed on Feb. 23, 2018, in the KIPO (Korean Intellectual Property Office), the disclosure of which is incorporated herein entirely by reference.

BACKGROUND OF THE INVENTION

Field of the Invention

The present invention relates to semiconductor technology, and more particularly, a non-volatile ferroelectric memory device and a driving method thereof.

Description of the Related Art

Recently, as demand for portable digital applications such as digital cameras, MP3 players, personal digital assistants (PDAs) and mobile phones has increased, and the conventional hard disks have been replaced by solid-state drives (SSD), the non-volatile memory market has rapidly expanded. As the typical non-volatile memory device, a NAND flash memory device realizing low cost and high integration may be enumerated.

The NAND flash memory device has a transistor cell structure based on a MOSFET and is classified into a floating gate type and a charge trap type memory device depending on the type of the information storage layer. Such a NAND flash memory device generally has a problem that distribution of a threshold voltage (Vth) of the memory cell transistor is widely observed as the I-V curve has a smooth slope, and as a result, the refresh margin is narrowed. This narrow refresh margin increases the read time, which is a barrier to improving the operation speed of the flash memory device.

In order to overcome such shortcomings as distribution of the threshold voltage of the conventional NAND flash memory device based on the floating gate type and charge trap type memory cell transistors, it is a technological solution to control the subthreshold swing SS. However, in the conventional NAND flash memory device, as a programming step is performed by injection of hot carriers, so it is theoretically impossible to reduce the SS value to less than 60 mV/dec because the physical lower limit of the SS value is limited to 60 mV/dec. In addition, since the conventional NAND flash memory device has a high operating voltage of about 20 V, it requires a special high voltage booster circuit in order to operate in a low voltage circuit. As a result, there is a demerit that much more power consumption is required.

Therefore, improvement of the dielectric stack constituting the conventional NAND flash memory device is required for reduction of the SS value and low-voltage driving. As a related attempt, a configuration of a NAND memory device using a ferroelectric field effect transistor FeFET has been proposed. However, in the case of a non-volatile NAND memory device configured by serially connecting the ferroelectric field effect transistors, other memory cells that are not selected to read data of a selected memory cell in one string must be turned on. For this purpose, it is considered as a general approach that a control voltage of a high voltage VPASS which is larger than a read voltage applied to the gate of the selected memory cell is applied to the control gate electrode of the selected memory cell.

However, the path voltage VPASS of the high voltage may cause a problem that the polarization direction of the ferroelectric layer is changed to cause data disturbance. For example, when the polarization direction of the ferroelectric layer of an unselected memory cell is oriented in the opposite direction of the channel layer (typically, it is defined as a programmed state), inversion (or depolarization) may happen such that the polarization direction of the ferroelectric substance is directed to the channel layer by the pass voltage VPASS. In this case, unintentional erasure of the memory cell may occur. This problem may be a great obstacle for realizing a non-volatile NAND memory device using a ferroelectric field effect transistor.

Therefore, a new driving method for preventing interference of unselected memory cells sharing the selected memory cell with a bit line during programming, reading, and erasing operations of a selected memory cell of a non-volatile NAND memory device using a ferroelectric field effect transistor is required. To this end, it is necessary to improve the dispersion margin of the threshold voltage Vth in order to improve the refresh margin and to improve the operation speed of the NAND memory device.

The present invention has been made in view of the above problems. That is, the technological object of the present invention is to provide a non-volatile ferroelectric memory device, wherein interference may be prevented or reduced between the unselected memory cells, which is generated due to a turn-on operation of the unselected memory cells sharing a bit line and the selected memory cell, during the programming, reading, and erasing operations of the selected memory cell; improve dispersion of the threshold voltage Vth for improving the refresh margin; and at the same time, improve the operating speed of the NAND memory device.

Further, according to another aspect of the present invention, there is provided a method of driving a non-volatile ferroelectric memory having the above-described advantages.

SUMMARY OF THE INVENTION

According to an embodiment of the present invention, a non-volatile ferroelectric memory device comprising a semiconductor active layer; a plurality of memory cells connected in series on the semiconductor active layer; and a control circuit for performing a read operation and a program operation on the selected memory cell among the plurality of memory cells may be provided. In such a non-volatile ferroelectric memory device, each of the memory cells includes a para-dielectric layer on the semiconductor active layer; a ferroelectric layer stacked on the para-dielectric layer; a dielectric stack having a charge trap site for generating a negative capacitance effect of the ferroelectric layer by charges disposed and trapped at an interface between the ferroelectric layer and the para-dielectric layer; and a control gate electrode on the ferroelectric layer. The subthreshold swing SS value of the memory cell may have less than 60 nmV/dec. The control circuit may allocate any one of an erase state or a program state in response to each of two polarities of charges trapped in the charge trap site. The control circuit may invert a polarization in the ferroelectric layer of the unselected memory cell in order to turn on at least one unselected memory cell sharing a bit line and the selected memory cell during a read operation for the selected memory cell, and the charges in the charge trap sites of the unselected memory cells may maintain a trap. Depolarization phenomenon of the ferroelectric layer may be induced by the electric charges trapped in the charge trap site and the inverted polarization of the ferroelectric layer. The control circuit is operable to make the charges within the charge trap site be maintained upon completion of a read operation with respect to the selected memory cell and is operable to control the inverted polarization in the ferroelectric layer to restore to the previous polarization by using a depolarization phenomenon of the ferroelectric layer. The control circuit may invert the polarization in the ferroelectric layer of the selected memory cell during program operation for the selected memory cell, move the charges in the charge trap site of the selected memory cell to the channel of the semiconductor active layer of the selected memory cell, and make other charges in the channel of the semiconductor active layer of the selected memory cell be trapped into the charge trap site. The transfer characteristic of the memory cell may be represented by a first voltage-current curve and a second voltage-current curve in a programmed state; the control circuit may be configured to apply a read voltage to the control gate electrode of the selected memory cell during the read operation, and to apply a pass voltage to a control gate electrode of at least one unselected memory cell sharing a bit line and the selected memory cell; and wherein the read voltage may be determined as a voltage between a first threshold voltage defined from the first voltage-current curve; and a second threshold voltage which is defined from the second voltage-current curve and is lower than the first threshold voltage, and the pass voltage may be determined as a voltage in an overlap region in which the second current-voltage curve overlaps. The control circuit may apply a program voltage to the control gate electrode of the selected memory cell during the program operation, and the program voltage may be determined as a voltage higher than the pass voltage in the overlap region. The ferroelectric layer may include an oxide ferroelectric, a fluoride ferroelectric, a ferroelectric semiconductor, a polymeric ferroelectric, or a mixture thereof, and the para-dielectric layer and the ferroelectric layer may have the same crystal structure. The crystal structure may be a perovskite, a fluorite, or a layered structure. A charge exchange time between the charge trap site and the channel of the semiconductor active layer through the para-dielectric layer is longer than a reading time of the read operation. The thickness of the ferroelectric layer may be in the range of 1 nm to 100 nm, and the thickness of the para-dielectric layer may be in the range of 1 nm to 100 nm.

According to another embodiments of the present invention, a method for driving a non-volatile ferroelectric memory device including a plurality of memory cells having a para-dielectric layer on a semiconductor active layer, a ferroelectric layer stacked on the para-dielectric layer, a dielectric stack having a charge trap site that generates a negative capacitance effect of the ferroelectric layer by the charge trapped and disposed at an interface between the para-dielectric layer and the ferroelectric layer, and a control gate electrode on the ferroelectric layer may be provided. The method may comprise a step for selecting one memory cell of the plurality of memory cells; a step for controlling the charge in the charge trap site of at least one unselected memory cell sharing the bit line and the selected memory cell to maintain a trap; and a step for inverting polarization in the ferroelectric layer of the unselected memory cell to turn on the unselected memory cell. The method for driving a non-volatile ferroelectric memory device may further a step for inducing a depolarization phenomenon of the ferroelectric layer by the charges trapped in the charge trap site, and the inverted polarization of the ferroelectric layer. Further, the method may further include a step for maintaining the charges in the charge trap site maintain the trap and for restoring the inverted polarization in the ferroelectric layer to a previous polarization using a depolarization phenomenon induced in the ferroelectric layer. According to one embodiment of the present invention, the method may further include a step for inverting polarization in the ferroelectric layer of the selected memory cell; and a tunnel switch step for moving charges in the charge trap site of the selected memory cell to channels of the semiconductor active layer of the selected memory cell, and for trapping other charges in the channel of the semiconductor active layer of the selected memory cell into the charge trap site.

According to an embodiment of the present invention, in case of a memory driving, it is possible to use a para-dielectric layer on the semiconductor active layer; a ferroelectric layer laminated on the para-dielectric layer; and a charge trap site that generates a negative capacitance effect and a tunnel switch effect of the ferroelectric layer by the charges disposed and trapped on an interface between the para-dielectric layer and the ferroelectric layer, or an interface between the semiconductor active layer and the para-dielectric layer. Therefore, it is possible to improve the failure of the unselected memory cells due to turning on of other unselected memory cells sharing the selected memory cell with the bit line during a read operation of the selected memory cell. Further, it is also possible to provide a non-volatile ferroelectric memory device that improves the refresh margin by improving the dispersion of the threshold voltage Vth and at the same time, improves the operating speed of the NAND memory device.

Further, according to another embodiment of the present invention, a method of driving a non-volatile ferroelectric memory device having the above-described advantages may be provided.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
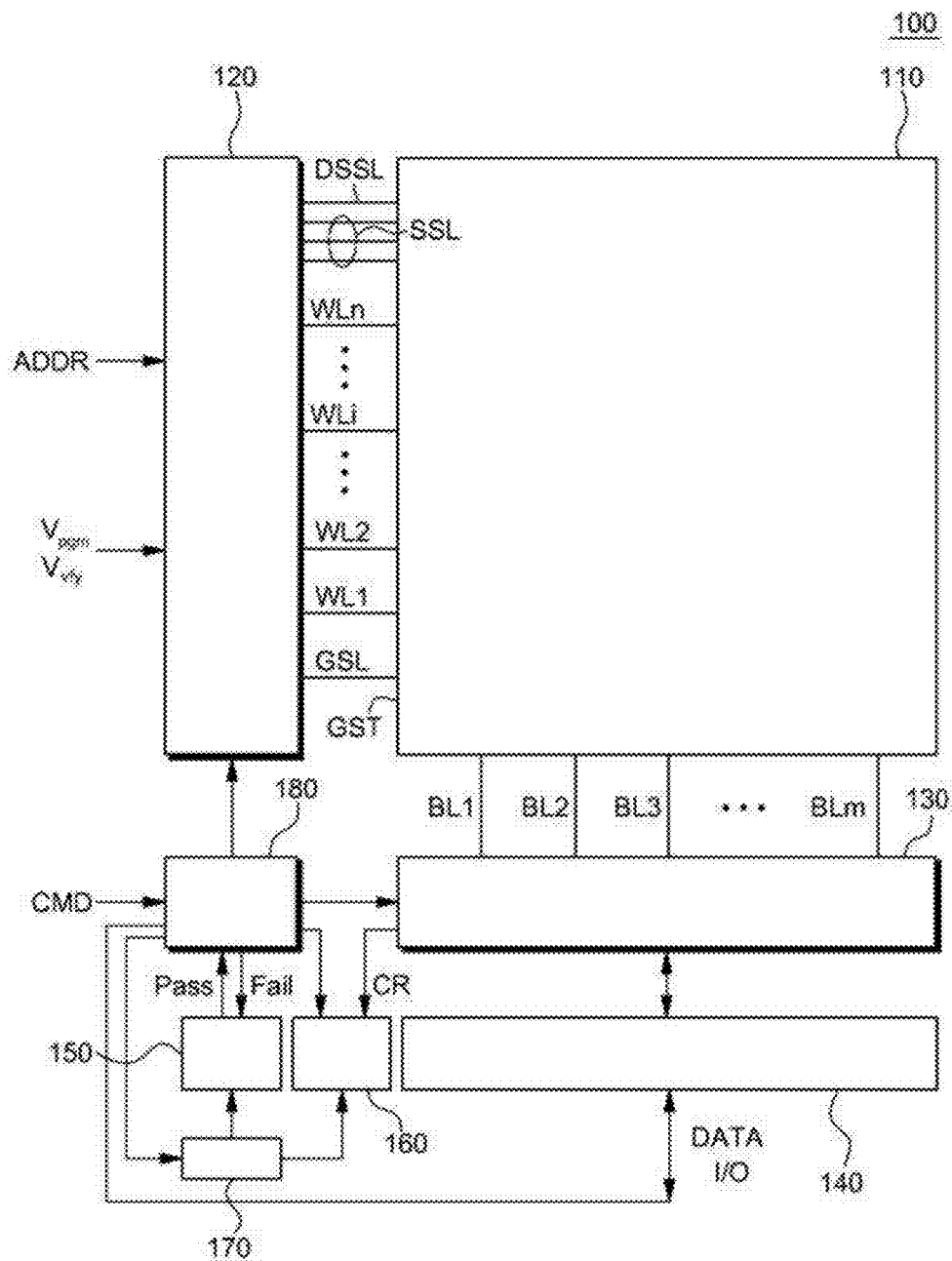
FIG. 1 is a block diagram showing the configuration of a non-volatile ferroelectric memory device according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

FIG. 1 is a block diagram showing a configuration of a non-volatile ferroelectric memory device 100 according to an embodiment of the present invention.

Referring to FIG. 1, a non-volatile ferroelectric memory device 100 includes a cell array 110 of plurality of memory cells, a row decoder 120, a read/write circuit 130, and column decoder 140. The memory cell array 110 may be connected to the row decoder 120 via the word lines WL1, WL2, ..., WLi, ..., WLn, the string select lines SSL, the dummy string select lines DSSL, and a ground line GSL. In addition, the memory cell array 110 may be connected to the read/write circuit 130 via bit lines BL1, BL2, BL3, ..., BLn.

When the non-volatile ferroelectric memory device 100 is a NAND flash memory device, the memory cell array 110 may include memory cell strings (not shown) in which a plurality of memory cells are serially connected. In one embodiment, one end of the memory cell strings is provided with a dummy string selection transistor (for example, NMOS selection transistor) for connecting the bit line and the string to each other, and at least more than one selection transistors SST serially connected to a dummy string selection transistor DSST may be arranged. The number of the string selection transistors SST may vary depending on whether the memory cell strings are arranged in a single layer; or a three-dimensional stack structure in which a plurality of layers are horizontally or vertically stacked, but the present invention is not limited thereto.

The other ends of the memory cell strings are connected to a common source line, and a ground selection transistor (GST, for example, NMOS selection transistor) for connecting to the common source line CSL may be provided.

The word lines WL1, WL2, . . . , WLi, . . . , WLn may be connected to the control gates of the memory cells arranged along the column direction, respectively. The bit lines BL1, BL2, BL3, . . . , BLn may be connected to one ends of the string selection transistors. A plurality of memory cells in the row direction in which the control gate electrodes are connected to the respective word lines WL1, WL2, . . . , WLi, . . . , WLn may constitute a logical page, and may be determined by a storage capacity of a memory cell. For example, depending on the storage level, a single level cell memory that stores 1 bit per memory cell, a multi-level cell MLC memory device that stores 2 bits per memory cell, an 8 LC memory device that stores 3 bits per memory cell, and a 16LC memory device storing 4 bits per memory cell may be provided.

The memory cells of the memory cell array 110 may have a two-dimensional array parallel to the main surface of the semiconductor substrate, or a channel vertical to the main surface of the semiconductor substrate, or a three-dimensional array structure in which one or more memory array layers are vertically stacked to the main surface of the semiconductor substrate. In one embodiment, the three-dimensional array structure may be, for example, a channel stacked structure, a straight BICs structure (straight-shaped Bit Cost Scalable structure), and a pipe type BICs (Bit Cost Scalable). It is to be understood that the invention is not limited thereto.

The memory cells constituting the page may be programmed in the same program cycle. For example, each memory cell connected to the first word line WL1 may be programmed with the same program state (or target value) in the same program cycle, or in different program states. For example, in one program cycle, one memory cell may be programmed to program state P1, another adjacent memory cell to second program state P2, and the other memory cells to third program state P3 have. However, this is only illustrative and the present invention is not limited thereto. In another embodiment, in case of a single level cell having an interleaved architecture, even and odd cells may constitute two different pages. For example, a SLC device of a 4 kB may have a word line of 65,536 memory cells. Also, in the case of a multi-level cell, each cell stores four Least Significant Bit LBS and one Most Significant Bit MSB. For example, in this case, the MSB and LSB pages on the even bit lines and the MSB and LSB pages on the odd bit line may be provided The row decoder 120 may control a plurality of string selection lines SSL and a dummy string selection line DSSL. In one embodiment, the row decoder 120 may select a plurality of string selection lines SSL, or simultaneously may be operated for a voltage or current driving.

Further, the row decoder 120 may also select any one of the word lines of the memory block. The row decoder 120 applies the word line voltage VWL generated from the voltage generator (not shown) to the word line of the selected memory block. In a program operation according to ISSP (Incremental Step Pulse Program) mode, the row decoder 120 may apply a program voltage VPGM and a verify voltage Vvfy to the selected word line Selected WL and may apply a pass voltage Vpass to the unselected word line Unselected WL.

The memory cell array 110 may be addressed by the bit lines BL1, BL2, BL3, . . . , BLn via the column decoder 140. The read/write circuit 130 may receive data transmitted from the outside via the column decoder 140 or output data to the outside The read/write circuit 130 may include a page buffer (not shown) and may operate as a sensing amplifier or as a write driver depending on the mode of operation. However, in this specification, the read/write circuit, or a page buffer may be used to have an equivalent meaning and should be understood as an interchangeable name. In a program operation, the read/write circuit 130 receives data from an external circuit and transfers the bit line voltage corresponding to the data to be programmed to the bit line of the cell array 110. During the read operation, the read/write circuit 130 may read the data stored in the selected memory cell through the bit line, latch the read data, and output it to the outside.

The read/write circuit 130 may measure a string current or a string voltage output to the bit line for programming verification during a programming process according to an incremental step pulse programming ISPP mode for initialization of the string selection transistor. A verification mode may be connected to the bit line and may be accomplished through the current sensing circuit. In one embodiment, the current sensing circuit may be provided in the read/write circuit 130.

The control logic 180 may program selected memory cells and/or string select transistors by executing program-verify loops in accordance with the ISPP mode. The pass/fail verification circuit 150 verifies, at each verification step, whether the memory cell and/or string select transistors have reached the desired target level or not, whenever the program loop count increases. The control logic 180 includes a row decoder 120, a read/write circuit 130, a column decoder 140, a pass/fail detector 150, a program loop sequence number detector 160 and/or a comparator 170 in order to perform a pulse program and verification operation in accordance with the ISPP mode. The program loop sequencer 160 and the comparator 170 are circuits for determining whether the memory cell to be programmed and/or the string selection transistor is an abnormal throw cell or a fast cell and may be omitted.

In various kinds of designs, the control logic 180 may be integrated on the same chip as the memory cell array 110 or may be arranged on another chip, and the present invention is not limited thereto.

Figure 2:
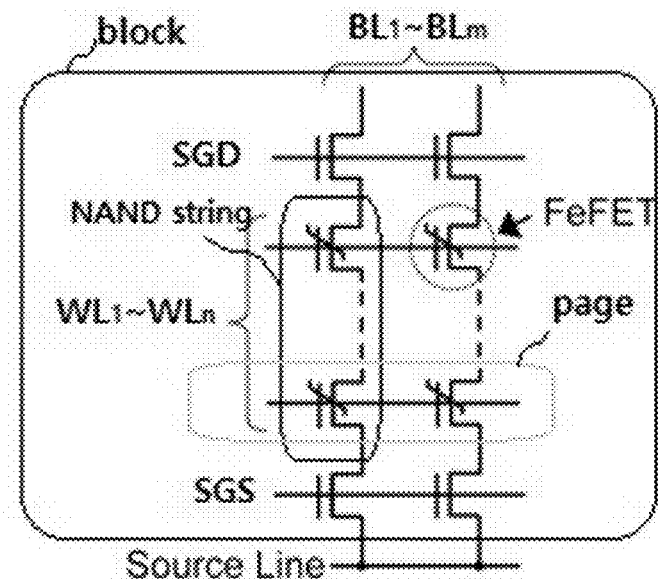
FIG. 2 is a block diagram showing a NAND ferroelectric memory cell array of a non-volatile ferroelectric memory device 100 according to an embodiment of the present invention.

FIG. 2 shows a block including a NAND ferroelectric memory cell array of a non-volatile ferroelectric memory device 100 according to an embodiment of the present invention.

Referring to FIG. 2, an example is illustrated wherein the NAND-type ferroelectric memory cell array of the non-volatile ferroelectric memory device 100 has an n×m size. The non-volatile ferroelectric memory device 100 may include a block consisting of the string selection transistors SGD of 1×m constituting a GSL connected to the page buffer (see 130 in FIG. 1), the transistors SGS of 1×m to be connected to a common source line, and the ferroelectric memory cells FeFET of n×m size. Although one block is illustrated by way of example in FIG. 2, the present invention is not limited thereto, and the non-volatile ferroelectric memory device 100 may include a plurality of blocks defined according to capacity.

The ferroelectric memory cells (FeFET) of n×m size in the block may be divided into the NAND strings of m number or divided into n pages. According to the present invention, one NAND string refers to memory cells that share one-bit line (e.g., BL1), and one page may refer to memory cells that share one-word line (e.g., WLn). The ferroelectric memory cell (FeFET) may be referred to FIG. 3B which shows a cross-sectional view that schematically shows an equivalent circuit of the memory cell and FIG. 4B which shows a cross-sectional view that schematically shows a memory cell shown to be described later.

In one embodiment, a plurality of ferroelectric memory cells (FeFETs) may be arranged in a first direction and a second direction, e.g., a bit line direction and a word line direction, to form a two-dimensional array. For example, a channel (not shown) may be formed along the bit line direction and a channel (not shown) may be formed discontinuously in the word line direction so as to be spaced apart from each other, for example, in a NAND structure. Further, a gate electrode (not shown) may be formed along the word line direction and may be discontinuously formed in the bit line direction such that the gate electrodes are spaced apart from each other. These channels (not shown) and gate electrodes (not shown) may intersect each other in a plurality of regions. The ferroelectric memory cell (FeFET) may be disposed in a region where a channel (not shown) and a gate electrode (not shown) cross each other. The channel (not shown) forms a bit line, and the gate electrode (not shown) forms a word line.

Figure 3A:
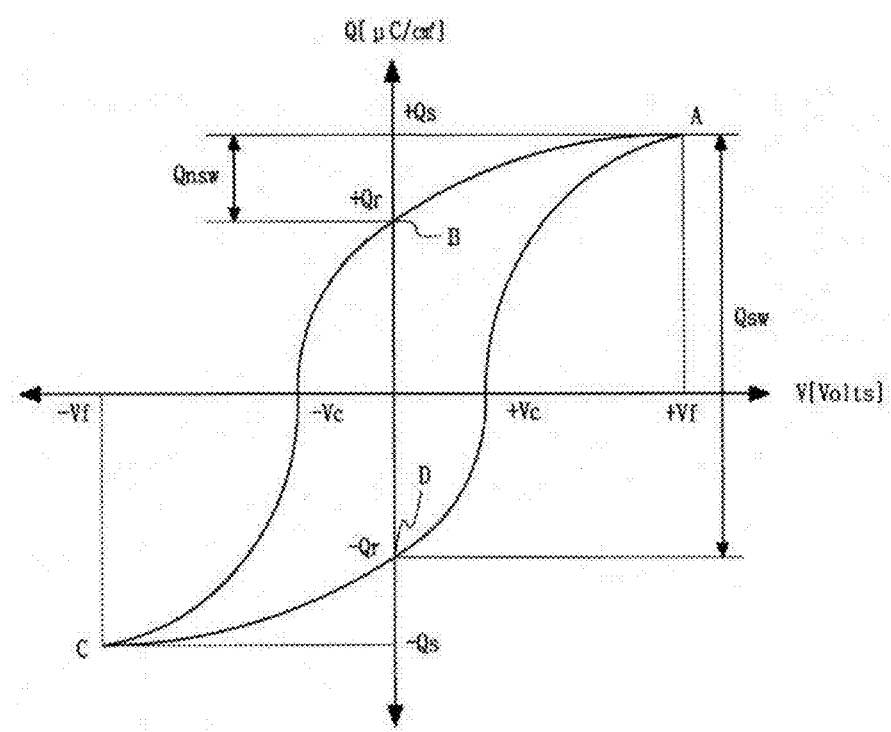
FIG. 3A is a diagram showing a hysteresis curve of a ferroelectric memory cell according to an embodiment of the present invention.
Figure 3B:
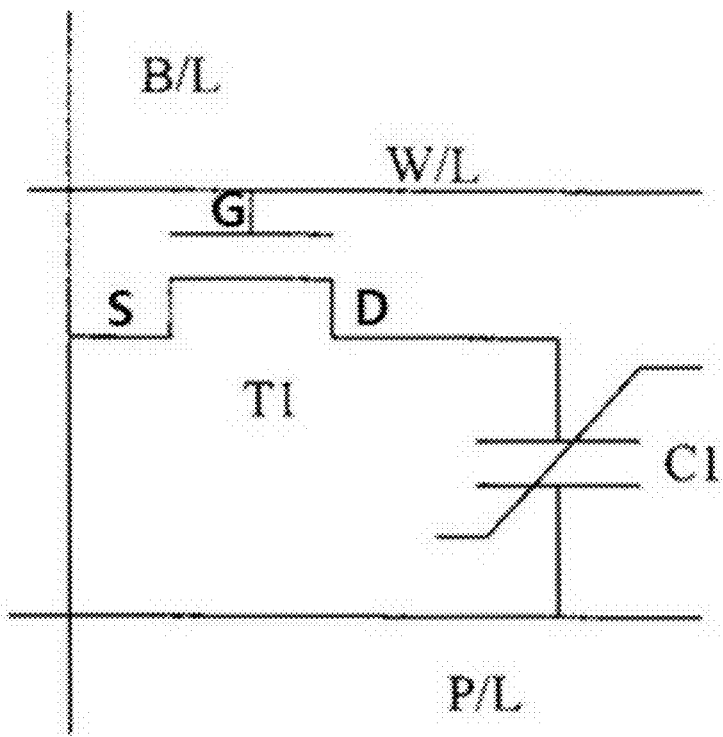
FIG. 3B is a diagram showing an equivalent circuit of a ferroelectric memory cell.

FIG. 3A shows a hysteresis curve based on changes of a voltage-charge amount of a ferroelectric memory cell according to an embodiment of the present invention, and FIG. 3B shows an equivalent circuit of a ferroelectric memory cell.

Referring to FIG. 3A, the ferroelectric memory cell may include a ferroelectric layer. When a ground voltage (Vss or 0 V) is applied to the gate electrode of the ferroelectric memory cell, polarization may not occur unless an electric field is applied to the ferroelectric layer. When the voltage applied to the gate electrode of the ferroelectric memory cell may be increased in the plus direction, the degree of polarization (or the amount of charge) may increase from zero to the state point A in the positive polarization region. At the state point A, the polarization may occur toward one direction, and the polarization degree at the state point A may reach a maximum value. At this time, the degree of polarization, that is, the amount of charges held by the ferroelectric layer, may be expressed as +Qs. Then, when the voltage applied to the gate electrode is reduced once again to the ground voltage (0V), the polarization degree may have a residual polarization represented by the residual polarization degree +Qr at the state point B without returning to zero. Thereafter, when the voltage applied to the gate electrode increases in the negative direction, the degree of polarization may change from the state point B to the state point C in the negative charge polarization region. At the state point C, the ferroelectric layer may be polarized in a direction opposite to the polarization direction at the state point A, which may be hereinafter referred to as polarization inversion. The degree of polarization at this time may be expressed as −Qs. Thereafter, even if the voltage applied to the gate electrode is reduced again to the ground voltage (0 V), the polarization degree remains at the state point D without being reduced to zero. At this time, the residual polarization degree at this time may be expressed as −Qr. When the magnitude of the voltage applied to the gate electrode increases once again in the positive direction, the degree of polarization of the ferroelectric layer changes from the state point D to the state point A. Therefore, such a state point A and a state point D may be defined as information '1', '0', or '0' and '1', respectively, so that they may be used as a memory cell.

Referring to FIG. 3B, the ferroelectric memory cell may have a 1T-1C structure including a transistor T1 and a ferroelectric capacitor C1. A bit line B/L is formed in a direction and a word line W/L intersecting the bit line B/L is formed. A plate line P/L is formed in the same direction as the direction of the word line W/L and at regular intervals between the word line W/L and the plate line P/L. The gate G of the transistor T1 is connected to the word line W/L, the source S of the transistor T1 is connected to the bit line B/L and the drain D of the transistor T1 may be connected to the first terminal of the ferroelectric capacitor C1. Then, the second terminal of the ferroelectric capacitor C1 may be connected to the plate line P/L.

Figure 4A:
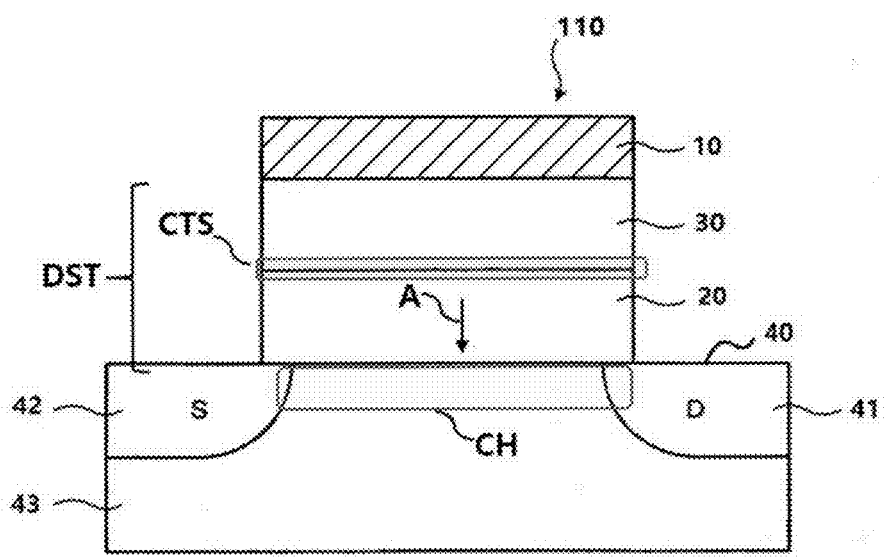
FIG. 4A and FIG. 4B are cross-sectional diagrams schematically illustrating an example of a memory cell array constituting a ferroelectric memory cell array according to an embodiment of the present invention.
Figure 4B:
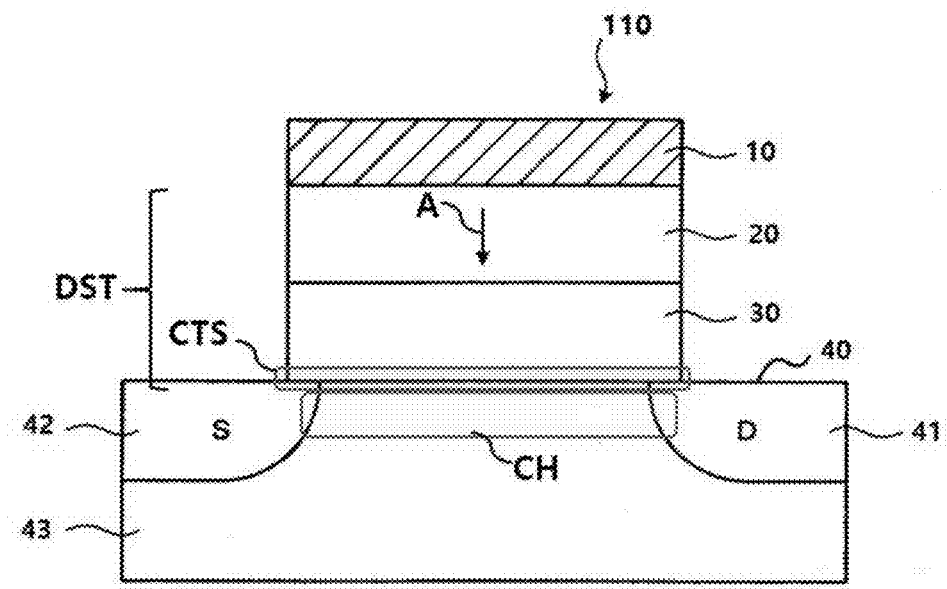
Figure 4C:
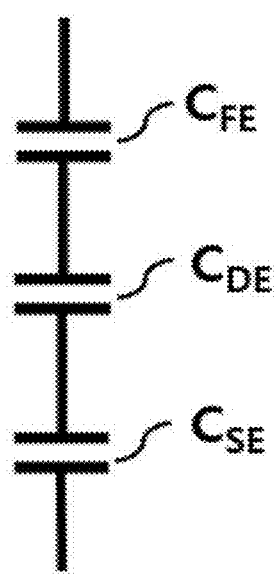
FIG. 4C is an equivalent circuit showing the memory cell as a transistor capacitance model.

FIG. 4A is a cross-sectional view schematically showing an example of a memory cell constituting a ferroelectric memory cell array according to an embodiment of the present invention, and FIG. 4B is an equivalent circuit showing a memory cell as a transistor capacitance model.

Referring to FIG. 4A, the ferroelectric memory cell 110 may include a gate electrode 10, a ferroelectric layer 20, a para-dielectric layer 30, and a semiconductor active layer 40. The semiconductor active layer 40 may include a drain region 41, a source region 42, and a semiconductor layer 43 that forms a channel between the drain region 41 and the source region 42. According to the present invention, the formation of the channel CH in the semiconductor active layer 40 may be referred to as on state of the ferroelectric memory cell 110 and a state that the channel CH is not formed in the semiconductor active layer 40 may be referred to as an off state of the ferroelectric memory cell 110. In one embodiment, when the polarization direction of the ferroelectric layer 20 becomes a direction of the arrow A, it is referred to as a negative polarization state, which is assigned to information '1'. When the polarization of the ferroelectric layer 20 is inversed and thus, becomes opposite to the arrow A, it may be referred to as a positive polarization state and may be assigned to information '0'. In yet another embodiment, the negative polarization state in the ferroelectric layer 20 may be assigned to information '0' and the positive polarization state in the ferroelectric layer 20 may be assigned to information '1'.

FIG. 4A shows an example wherein one memory cell is disposed on the semiconductor active layer 40, but a plurality of drain regions D and a plurality of source regions S may be spaced apart on one semiconductor layer 42. At this time, a plurality of memory cells may be connected in series on the semiconductor active layer 40. Each of the memory cells 110 includes a dielectric stack DST including a phase insulating layer 30 on the semiconductor active layer 40, a ferroelectric layer 20 laminated on the phase insulating layer 30 and a charge trap site CTS that is disposed at an interface between the ferroelectric layer 20 and the upper dielectric layer 30, and generates a negative capacitance effect of the ferroelectric layer 20 by the trapped charge, and the gate electrode 10 on the ferroelectric layer 20.

The charge trap site CTS may trap negative charges by the erase operation and positive charges may be trapped by the program operation. In some embodiments, positive charges may be trapped by the erase operation and negative charges may be trapped by the program operation.

To be more specific, the charge trap site CTS traps compensating charges opposite in polarity to the ferroelectric polarization charge at the interface during the erase operation, and the compensating charges trapped even though the pass voltage VPASS is applied may be continuously maintained after the erase operation. And when the program voltage VPGM is applied after the erase operation, the charges of the opposite sign may be trapped. Specifically, when a pass voltage VPASS lower than the program voltage VPGM is applied, the trapped charges in the charge trap site CTS are maintained, but when the program voltage VPGM is applied, the polarization of the ferroelectric is changed. Therefore, the compensating charges of the opposite sign corresponding to this change may be trapped in the charge trap site CTS by tunneling the phase insulating layer 30 from the semiconductor active layer 40 (hereinafter referred to as a tunnel switch).

In one example, the memory cell 110 has a MFIS (Metal Ferroelectric Insulator Semiconductor) structure, but the present invention is not limited thereto. For example, the memory cell 110 may be a MFS (Metal Ferroelectric Semiconductor) structure or a MFMIS (Metal Ferroelectric Metal Insulator Semiconductor) structure.

In another embodiment, an upper dielectric layer 30 may be disposed between the ferroelectric layer 20 and the gate electrode 10, as shown in FIG. 4B. In this case, a charge trap site CTS that generates the negative capacitance effect of the ferroelectric layer 20 due to the trapped charge may be defined at the interface between the phase insulating layer 30 and the semiconductor active layer 40. If the gate electrode 10, the ferroelectric layer 20, the para-dielectric layer 30, and the semiconductor active layer 40 of the ferroelectric memory cell 110 of FIG. 4B are consistent with those of FIG. 4A, the ferroelectric memory cell 110 of FIG. 4B may refer to the explanation about the gate electrode 10, the ferroelectric layer 20, the para-dielectric layer 30 and the semiconductor active layer 40 of FIG. 4A.

In one embodiment, the subthreshold swing SS value of the memory cell 110 may have a value less than 60 nmV/dec so that the negative capacitance effect of the ferroelectric layer 20 may be generated. In another embodiment, in order to turn on the memory cell 110 using the inverse domain present in the ferroelectric layer 20 without inverting the polarization state in the ferroelectric layer 20, the SS value of the memory cell 110 may have a range of 100 mV/dec to 300 nmV/dec.

The gate electrode 10 may include conductive metals such as platinum Pt, ruthenium Ru, iridium Ir, silver Ag, aluminum Al, titanium Ti, tantalum Ta, tungsten W, Copper Cu, nickel Ni, cobalt Co, or molybdenum Mo, or alloys thereof. These materials are only illustrative, and the present invention is not limited thereto. For example, the gate electrode 10 may be formed of a conductive nitride (e.g., TiN, MoN, etc.) of the above-mentioned metals, a conductive oxygen nitride (e.g., TiON) of the above-mentioned metals, or a combination thereof (e.g., TiSiN, TiAlON Etc.). Further, the gate electrode 10 may comprise polysilicon in which the impurity is over-doped.

The ferroelectric layer 20 may include an oxide ferroelectric, a fluoride ferroelectric, a ferroelectric semiconductor, a polymeric ferroelectric or a mixture thereof. The oxide ferroelectric may include at least any one selected from the group consisting of hafnium oxide HfOx, zirconium oxide ZrOx, titanium oxide TiOx, hafnium oxide zirconium HfZrOx, hafnium oxide titanium HfTiOx, hafnium oxide silicon HfSiOx, nickel NiO, tantalum oxide TaOx, aluminum oxide AlOx, zirconium oxide ZrOx, copper oxide CuOx, niobium oxide NbOx, tantalum oxide TaOx, gallium oxide GaOx, gadolinium oxide GdOx, manganese oxide MnOx, PrCaMnO, and ZnONiOx. Alternatively, the oxide ferroelectric may be a perovskite ferroelectric such as PZT ($PbZrxTi1-xO_3$), $BaTiO_3$ and $PbTiO_3$; a pseudo-ilmenite ferroelectric such as $LinbO_3$ and $LiTaO_3$; a tungsten-bronze TB ferroelectric such as $PbNb_3O_6$, $Ba_2NaNb_5O_{15}$; a bismuth layered ferroelectric such as SBT ($SrBi_2Ta_2O_9$), BLT (($Bi,La)_4Ti_3O_{12}$), $Bi_4Ti_3O_{12}$; a pyrochlore ferroelectric material such as $La_2Ti_2O_7$; and solid solutions of these ferroelectric materials; and $RMnO_3$ and PGO ($Pb_5Ge_3O_{11}$) and BFO ($BiFeO_3$) containing a rare earth element R such as Y, Er, Ho, Tm, Yb and Lu. The ferroelectric semiconductor may include a Group 2-6 compound such as cdZnie, CdZnS, CdZnSe, CdMnS, CdFeS, CdMnSe, and CdFeSe. The polymeric ferroelectric may include at least more than one selected from the group consisting of polyvinylidene fluoride PVDF, a polymer comprising PVDF, a copolymer comprising PVDF, a terpolymer comprising PVDF, an odd number of nylons, a cyano polymer and polymers or copolymers thereof. These materials of the ferroelectric layer 20 are only illustrative, and the present invention is not limited thereto. Preferably, the ferroelectric layer 20 may comprise a metal oxide of a fluorite structure having at least one stable compositional region selected from cubic normal, tetragonal, and monocyclic. For example, the metal oxide of the fluorite structure may include $ZrO_2$ doped with elements such as HfO2, Si, Al, La, and Gd doped with elements such as Si, Al, La, and Gd, or a combination thereof.

The thickness of the ferroelectric layer 20 may have a range of 1 nm to 100 nm in consideration of a voltage applied to the gate electrode such as a read voltage, a program voltage, and a pass voltage. Preferably, the thickness of the ferroelectric layer 20 may be 10 nm. When the thickness of the ferroelectric layer 20 is 1 nm or less, it is difficult to ensure sufficient polarization for data storage, and accordingly, retention of the memory may be deteriorated. When the thickness of the ferroelectric layer 20 is 100 nm or more, the read voltage and the program voltage may become large, which may make it difficult to operate at a low voltage.

The material of the para-dielectric layer 30 may be similar or identical to that of the ferroelectric layer 20. Preferably, the para-dielectric layer 30 may comprise a silicon oxide but is not limited to it. The thickness of the para-dielectric layer 30 may range from 1 nm to 100 nm in order to form charge trap sites CTS that cause a negative capacitance effect at the interface between the semiconductor active layer 40 and the phase insulating layer 30. For example, when the thickness of the para-dielectric layer 30 is 100 nm or more, the gate voltage is increased and the memory operation voltage may be increased. When the thickness is 1 nm or less, the negative capacitance in the ferroelectric layer 30 will not be stabilized and hysteresis behavior will be exhibited. Therefore, the obstacle may be generated to the desirable read behavior.

In one embodiment, after the completion of the turn-on operation of the unselected memory cell, the control circuit (see 180 in FIG. 1) for driving the memory cell 110 may make the unselected memory cells $C_{21}$, $C_{23}$, and $C_{24}$ be turned on by simultaneously applying the pass voltage Vpass to $C_{21}$, $C_{23}$, and $C_{24}$ that share the bit line BL2 with the selected memory cell C $C_{21}$, $C_{23}$, and $C_{22}$ when the read voltage Vread is applied to the unselected memory cells $C_{22}$ as shown in FIG. 5 to be described later. The charge trapped in the charge trap site CTS has a polarity (for example, a negative charge) corresponding to the erase state when the path voltage Vpass applied to the unselected memory cells $C_{21}$, $C_{23}$, and $C_{24}$ is cut off or removed. Further, as a result of it, the inverted polarization state in the ferroelectric layer 20 may be controlled to return to the previous polarization state due to the depolarization phenomenon generated by the charge trap site CTS. Specifically, when the pass voltage Vpass is applied, the first polarization state of the ferroelectric layer 20 is inverted to the second polarization state. But, when the pass voltage Vpass is cut off or removed, the second polarization state may be returned the first polarization state. At this time, the trapped charges in the charge trap site CTS may be maintained. The first polarization state may be a positive polarization state and the second polarization state may be a negative polarization state. In some embodiments, the first polarization state may be a negative polarization state and the second polarization state may be a positive polarization state.

Figure 5A:
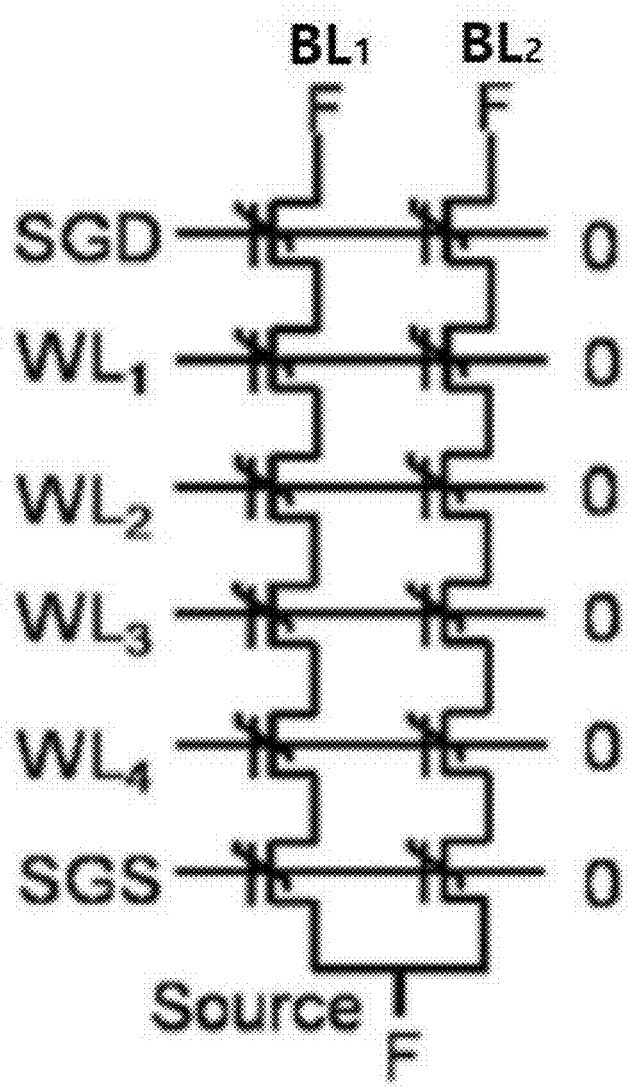
FIG. 5A is a diagram for explaining an erase operation in a 4×2 NAND ferroelectric memory array according to an embodiment of the present invention.

In one embodiment, the control circuit may further perform an erase operation on the plurality of memory cells before the program operation of the selected memory cell, as shown in FIG. 5A, which will be described later. Further, in FIG. 5B, which will be described later, during the program operation of the selected memory cell, the tunnel switch is made, so that a polarity (for example, positive charge) corresponding to the erase state in the charge trap site CTS may be changed into a polarity (negative charge) corresponding to the program state. Further, the polarization state (for example, positive polarization state) corresponding to the erase state in the ferroelectric layer 20 may be controlled to be inverted to the polarization state (for example, negative polarization state) corresponding to the program state.

In one embodiment, when referring to the hysteresis Id–Vg curve of the memory cell of FIG. 6 or FIG. 9 to be described later, the transfer characteristic of the memory cell is denoted by the first voltage-current curve ERS in the erase state and the second voltage-current curve PGM. The control circuit applies a read voltage to the control gate electrode of the selected memory cell during the read operation of the control circuit and applies a pass voltage Vpass or Vss to the control gate electrode of at least one unselected memory cell sharing a bit line and the selected memory cell. The read voltage may be determined as a voltage between a first threshold voltage defined from the first voltage-current curve, and the second threshold voltage which is defined from the second voltage-current curve and is lower than the first threshold voltage. The pass voltage Vpass or Vrp may be determined as the voltage in the overlap region in which the second current-voltage curve overlaps with the first threshold voltage.

In one embodiment, the control circuit applies a program voltage to the control gate electrode of the selected memory cell during the programming operation, and the program voltage VPGM may be determined as being larger than that of the pass voltage Vpass or Vrp in the overlap region.

FIG. 4B is a capacitor equivalent circuit of the ferroelectric memory cell 110. The capacitor equivalent circuit of the ferroelectric memory cell 110 may include a first capacitor CFE formed by the ferroelectric layer 20, a second capacitor CDE formed by the para-dielectric layer 30, and a third capacitor CSE formed by the semiconductor active layer 40. The first capacitor CFE, the second capacitor CDE and the third capacitor CSE may be connected in series. The first capacitor CFE may have a negative capacitance NC, and the second capacitor CDE and the third capacitor CSE may have at least one positive capacitance.

According to an embodiment of the present invention, the ferroelectric layer 20 may have a negative capacitance at an operating temperature of room temperature when forming a solid solution by the ferroelectric layer 20 and the para-dielectric layer 30. In one embodiment, the ferroelectric layer 20 may have a negative capacitance because the ferroelectric layer 20 and the para-dielectric layer 30 having crystal structure of same lattice constant form a solid solution. In another embodiment, the ferroelectric layer 20 may have a negative capacitance when forming a solid solution together with the para-dielectric layer 30 having the same or similar crystal structure as that of the ferroelectric layer 20. In still another embodiment, the ferroelectric layer 20 may have a negative capacitance when the ferroelectric layer 20 having a first perovskite crystal structure and a para-dielectric material having a second perovskite crystal structure forms a solid solution. Alternatively, the ferroelectric layer 20 may have a negative capacitance due to the combination thereof. Here, the first perovskite crystal structure may be the same as or different from the second perovskite crystal structure. Preferably, the polarization in the ferroelectric layer 20 may maintain a homogeneous polarization state having all the same polarization, so that the ferroelectric layer 20 may have the characteristic of negative capacitance. For this purpose, a single crystal thin film formed through epitaxial growth of the ferroelectric layer 20 is suitable. Therefore, in case of the structure illustrated in FIG. 4A, the ferroelectric layer 20 is stacked on the para-dielectric layer 30 and thus, the crystal structure of the ferroelectric layer 30 may be same as that of the ferroelectric layer 20.

In one embodiment, when the ferroelectric layer 20 is in a negative capacitance state, the subthreshold swing SS value of the ferroelectric memory cell 110 may be less than the theoretical limit of 60 mV/dec (Boltzmann tyranny). Specifically, when a specific gate voltage Vg is applied to the gate stack, the gate voltage Vg is inversely proportional to the capacitances CFE, CDE and CSE of the respective regions, and the may be distributed ferroelectric layer 20, the para-dielectric layer 30, and the semiconductor active layer 40, respectively. Therefore, if the first capacitor CFE is negative, the sum of the voltages distributed to the para-dielectric layer 30 and the semiconductor active layer 40 must be greater than the gate voltage Vg, and under the condition of the second capacitor CDE>>third capacitor CSE, the surface potential of the semiconductor active layer 40 must be higher than the gate voltage Vg, so that the SS value may be less than 60 mV/dec. The hysteresis Id–Vg curve of the ferroelectric memory cell 110 having an SS value less than 60 mV/dec is shown in FIG. 6 described later.

Figure 5B:
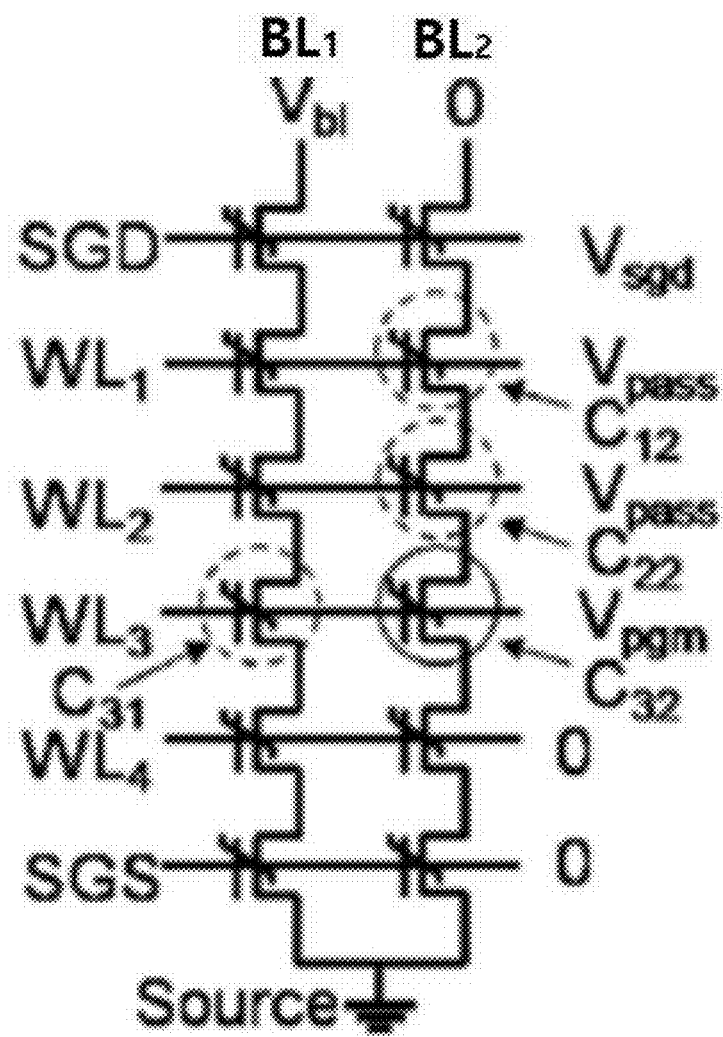
FIG. 5B is a diagram for explaining a program operation in a 4×2 NAND ferroelectric memory array.
Figure 5C:
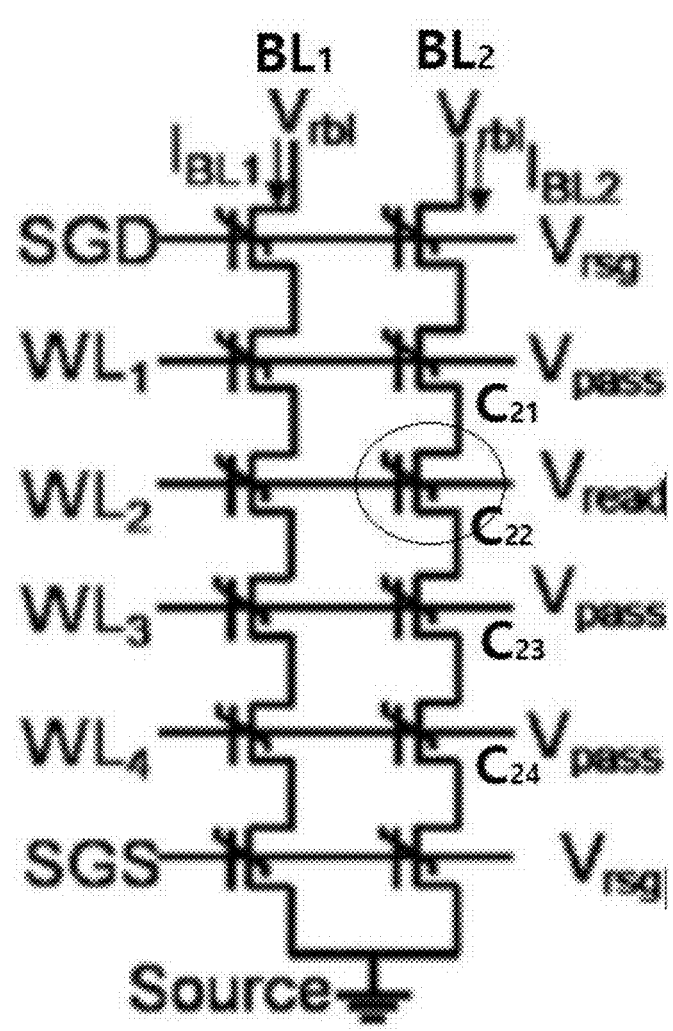
FIG. 5C is a diagram for explaining a read operation in a 4×2 NAND ferroelectric memory array.

FIG. 5A is a view for explaining an erase operation in a 4×2 NAND ferroelectric memory array according to an embodiment of the present invention, FIG. 5B is a diagram for explaining a program operation in a 4×2 NAND ferroelectric memory array, and FIG. 5C is a diagram for explaining a read operation in a 4×2 NAND ferroelectric memory array.

Referring to FIG. 5A, during the erase operation for at least one memory cell in the NAND ferroelectric memory array, data of all memory cells in the NAND ferroelectric memory array may be erased. For example, data of 8 memory cells in the NAND ferroelectric memory array may be erased by floating the source line SOURCE and all the bit lines BL1 and BL2 and applying 0V to all the word lines WL1 to WL4, SGD line and SGS line. Hereinafter, as shown in FIG. 5B, after a program operation is performed on at least one memory cell, a read operation may be performed on the selected memory cell as shown in FIG. 5C. In another embodiment, after the read operation is performed on the selected memory cell as shown in FIG. 5C, it may be performed after the program operation on the at least one memory cell as shown in FIG. 5B.

Referring to FIG. 5B, after an erase operation is performed on all the memory cells of FIG. 5A, a program operation may be performed on a selected memory cell (e.g., C32). For example, a voltage Vsgd may be applied to the SGD line in order to turn on the transistors of the SGD line, a voltage of 0V may be applied to the SGS line to turn off the transistors of the SGS line, and program voltage $V_{PGM}$ may be applied to the selected memory cell (for example, $C_{32}$). At this time, 0V is applied to the bit line BL0 and the program voltage $V_{PGM}$ is applied to the word line WL3 so that the memory cell (for example, $C_{32}$) may be selected. Therefore, $C_{32}$ may be programmed by a sufficient voltage difference $V_{PGM}$ generated between the gate electrode 10 and the channel (not shown) in the semiconductor active layer 40. At this time, Vb1 voltage may be applied to the unselected bit line BL1 and the Vpass voltage may be applied to the unselected word lines WL1 and WL2. Here, when applying the Vpass voltage to the unselected word lines WL1 and WL2 to reduce the disturbance of the memory cell $C_{31}$, the memory cells $C_{12}$ and $C_{22}$ may instead be disturbed by the pass voltage Vpass. The word line WL4 between the selected word line WL3 and the SGS line may be grounded to avoid unnecessary disturbance of memory cells C41 and C42. Although programming operation has been described with respect to one memory cell C32 in FIG. 5B, a program operation may be further performed on at least one or more memory cells different from the memory cell $C_{32}$.

Referring to FIG. 5C, after the program operation for the memory cells of FIG. 5B, a read operation may be performed on one selected memory cell $C_{22}$. Specifically, the read voltage Vread may be applied to the word line WL2 of the selected memory cell $C_{22}$, and the Vpass voltage may be applied to the unselected word lines WL1, WL3 and WL4. This means that the pass voltage Vpass is applied to other memory cells $C_{21}$, $C_{23}$ and $C_{24}$ sharing the bit line with the selected memory cell $C_{22}$, so that the unselected memory cells $C_{21}$, $C_{23}$ and $C_{24}$ may be turned on. The pass voltage Vpass of the read operation and the pass voltage Vpass of the program operation of FIG. 5B may have the same or different values.

Due to the serial configuration of the memory MOSFETs in the NADD chain structure, the other unselected memory cells $C_{21}$, $C_{23}$ and $C_{24}$, except the selected memory cell $C_{22}$, must be turned on during the read operation. But, this step may inevitably interfere with the off state of the FeFET. Therefore, when the selected memory cell $C_{22}$ is read, there is a chance that the data stored in the off-state FeFET is lost, which may be a serious problem. This adverse influence is basically may be caused by the ferroelectric polarization inversion from +P (positive polarization state is turned off) to −P (on state having negative polarization state) when the pass voltage Vpass is applied to the unselected cells $C_{21}$, $C_{23}$ and $C_{24}$.

Figure 9:
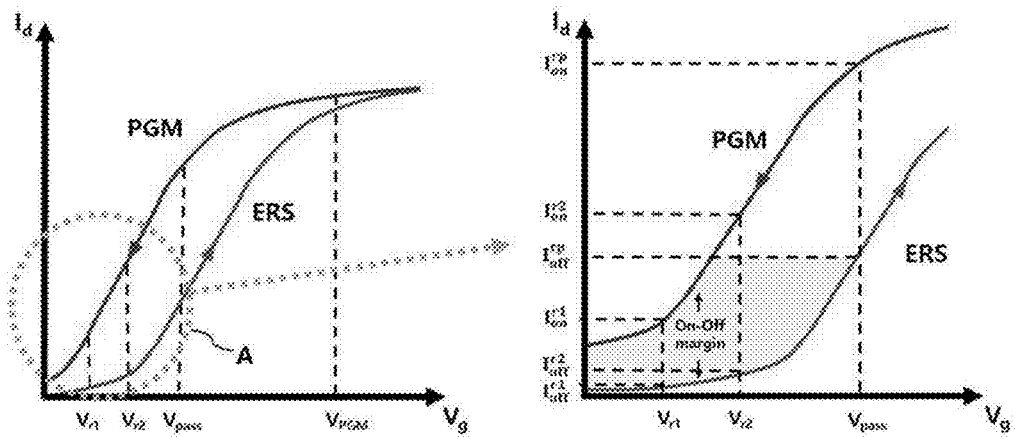
FIG. 9 is a diagram showing hysteresis Id–Vg curves of a memory cell in a NAND ferroelectric memory array according to another embodiment of the present invention.

In general, the ferroelectric memory shows a hysteresis Id–Vg curve similar to that of a flash memory operated by a conventional clockwise hysteresis curve, but as shown in FIG. 6 or FIG. 9 to be described later, the ferroelectric memory 100 may perform a read and program operations according to the counter-clockwise hysteresis curve. Unlike the conventional flash memories, the OFF state of the ferroelectric memory 100 is induced by the sufficiently large negative gate voltage Vg and thereby, the positive polarization state of the ferroelectric layer 20 of the gate stack may be induced. Thus, the erase state of the ferroelectric memory 100 corresponds to the off state, and it is possible to make the ferroelectric memory 100 be turned on by performing a polarization inversion process from the positive polarization (+P) to the negative polarization (−P) 100) of a sufficiently large amount of the gate voltage Vg. Since this corresponds to the program state (on state), the hysteresis $I_d$-$V_g$ curve has a counter-clockwise rotation direction.

As described above, during the read operation of the selected memory cell, even if the unselected memory cells are turned on from the off state, that is, they are inversed from the positive polarization state to the negative polarization state, the ferroelectric memory cell 110 of the present invention may need a read driving method for suppressing data destruction for unselected memory cells. The hysteresis $I_d$-$V_g$ curve of FIG. 6, which will be described later, makes use of the negative capacitance effect of the ferroelectric material, and when the pass voltage Vpass of the read operation is not applied even if inversion from the positive polarization state to the negative polarization state may generated, the data is restored to the previous polarization state due to depolarization phenomenon and data destruction may be suppressed. Alternatively, the ferroelectric memory 100 is turned on by some inverse domains among the multiple domains that controls the polarization state of the ferroelectric even if the ferroelectric memory 100 is not inverted from the positive polarization state to the negative polarization state by a hysteresis $I_d$-$V_g$ curve of FIG. 9 to be described later, so that data destruction may be suppressed.

Figure 6A:
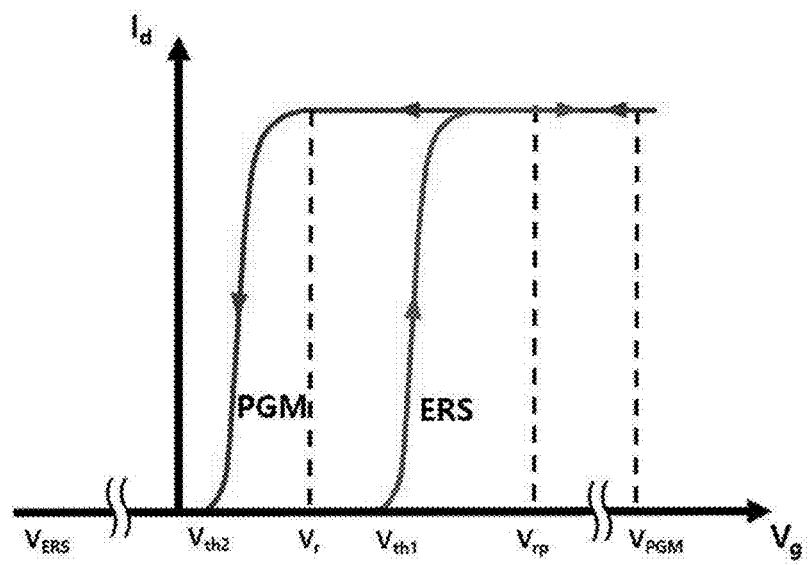
FIGS. 6A and 6B are diagrams showing a hysteresis Id–Vg curve of a memory cell in a NAND ferroelectric memory array according to an embodiment of the present invention.
Figure 6B:
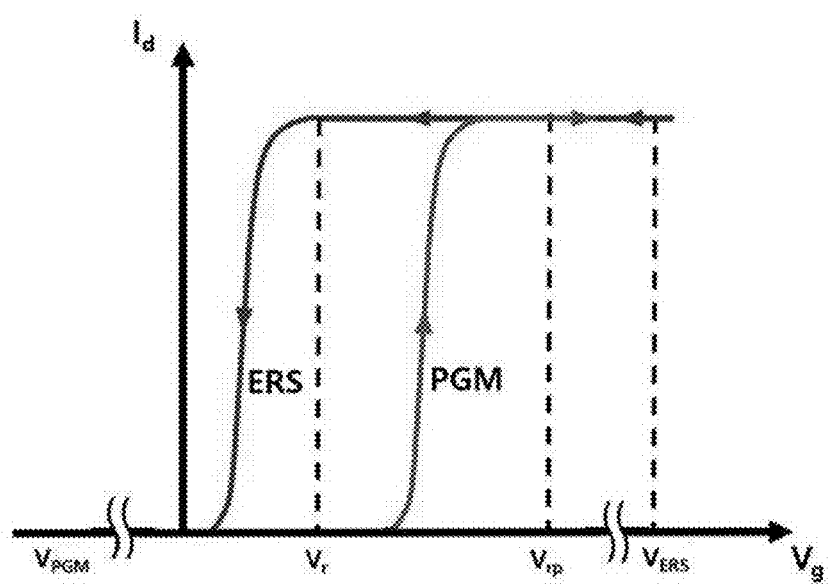

FIGS. 6A and 6B are diagrams showing a hysteresis $I_d$-$V_g$ curve of a memory cell in a NAND ferroelectric memory array according to an embodiment of the present invention. 6A and 6B show a hysteresis $I_d$-$V_g$ curve when the SS value of the memory cell is 60 mV/dec or less, preferably less than 50 mV/dec.

Referring to FIG. 6A, when a large negative erase voltage VERS is applied to the gate electrode of the ferroelectric memory cell 110, a positive polarization is formed in the ferroelectric layer 20, at which time the ferroelectric memory cell 110 may be defined as an off state (zero). Further, since the positive polarization in the ferroelectric layer 20 interferes with the charge flow of the channel CH, the first threshold value Vth1 may be increased. The first threshold value Vth1 may be a threshold value for turning on the memory cell in the erase state.

Thereafter, when a positive program voltage VPGM is applied to the gate electrode of the ferroelectric memory cell 110, a negative polarization may be formed in the ferroelectric layer 20, at which time the ferroelectric memory cell 110 is defined as an on state (=1'). Further, since the negative polarization in the ferroelectric layer 20 improves the charge flow of the channel CH, the second threshold value Vth2 lower than the first threshold value Vth1 may be lowered. The second threshold value Vth2 may be a threshold value for turning off the memory cell.

As described above, the ferroelectric memory cell 110 may operate as a memory element by maintaining the erase state by using the erase voltage VERS or by maintaining the program state by the program voltage $V_{PGM}$. At this time, the erase state or the program state in the ferroelectric memory cell 110 may be read through the read voltage Vr defined by the voltage between the first threshold value Vth1 and the second threshold value Vth2. Specifically, when a current corresponding to the erase state is sensed by the control circuit, a value of '0' may be read as the sensed current value. When the current corresponding to the program state is sensed, the sensed current value may be read as a value '1'. Alternatively, when a current corresponding to the erase state is sensed, a value of '1' may be read as the sensed current value, and if the current corresponding to the program state is sensed, a value of '0' may be read as the sensed current value.

Alternatively, when the path voltage $V_{pass}$ which is smaller than the program voltage $V_{PGM}$ and is larger than the first threshold value Vth1, that is, the voltage defined between the program voltage $V_{PGM}$ and the first threshold value Vth1, is applied to the ferroelectric memory cell 110, the polarization state of the ferroelectric layer 20 is inverted to turn on the ferroelectric memory cell 110, and when the pass voltage Vpass is cut off or removed, it is possible to return to the previous polarization state. This is due to the charge trap site (CTS) due to the negative capacitance effect of the ferroelectric layer 20 described above. On the other hand, when the pass voltage Vpass is applied to the programmed ferroelectric memory cell 110, the ferroelectric memory cell 110 is already turned on and the polarization inversion of the ferroelectric layer 20 may not occur.

In FIG. 6A, as the first threshold value Vth1 is set as a threshold value for turning on the memory cell in the erase state ERS, a second threshold value Vth2 lower than the first threshold value Vth1 may be defined as a threshold value for turning off the memory cells in the programmed state. In other embodiments, as illustrated in FIG. 6B, as the first threshold value Vth1 is set as a threshold value for turning on the memory cells in the programmed state, a second threshold value Vth2 lower than the first threshold value Vth1 may be defined as a threshold value for turning off the memory cell in the erase state ERS.

Referring FIG. 6B, when a large negative program voltage VPGM is applied to the gate electrode of the ferroelectric memory cell 110, a positive polarization is formed in the ferroelectric layer 20, and at this time, the ferroelectric memory cell 110 may be defined as an off state (zero). Further, since the positive polarization in the ferroelectric layer 20 interferes with the charge flow of the channel CH, the first threshold value Vth1 may be increased. The first threshold value Vth1 may be a threshold value for turning on the memory cells in the programmed state.

Thereafter, when a positive erase voltage VERS is applied to the gate electrode of the ferroelectric memory cell 110, a negative polarization is formed in the ferroelectric layer 20, at which time the ferroelectric memory cell 110 may be defined as an on state (=1'). Further, since the negative polarization in the ferroelectric layer 20 improves the charge flow of the channel CH, the second threshold value Vth2 lower than the first threshold value Vth1 may be lowered. The second threshold value Vth2 may be a threshold value for turning off the memory cell.

As described above, the ferroelectric memory cell 110 may operate as a memory element by maintaining the erase state by the erase voltage $V_{ERS}$ or by maintaining the program state by the program voltage $V_{PGM}$. At this time, the erase state or program state in the ferroelectric memory cell 110 may be read through the read voltage Vr defined by the voltage between the first threshold value Vth1 and the second threshold value Vth2. Specifically, when a current corresponding to the erase state is sensed by the control circuit, a value of '0' may be read. When the current corresponding to the program state is sensed, the sensed current value may be read as a value '1'. When a current corresponding to the erase state is sensed by the control circuit, a value of '1' may be read. When the current corresponding to the program state is sensed, the sensed current value may be read as a value '0'.

Alternatively, when a pass voltage Vpass which is smaller than the erase voltage VERS and which is larger than the first threshold value Vth1, that is, the voltage between the program voltage VPGM and the first threshold value Vth1, is applied to the ferroelectric memory cell 110, the polarization state of the ferroelectric layer 20 is inverted to turn on the ferroelectric memory cell 110, and when the pass voltage Vpass is cut off or removed, it is possible to return to the previous polarization state. This is due to the charge trap site (CTS) due to the negative capacitance effect of the ferroelectric layer 20 described above. On the other hand, when the pass voltage Vpass is applied to the ferroelectric memory cell 110 in the erase state, the ferroelectric memory cell 110 is already turned on and the polarization inversion of the ferroelectric layer 20 may not occur.

Figure 7A:
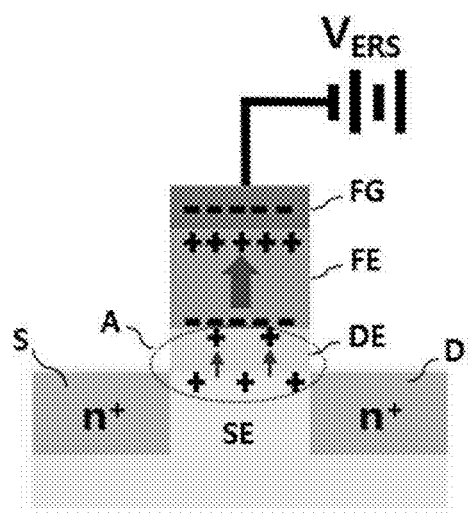
FIG. 7A is a diagram for explaining an erase operation of a memory cell in a ferroelectric memory array according to an embodiment of the present invention.
Figure 7B:
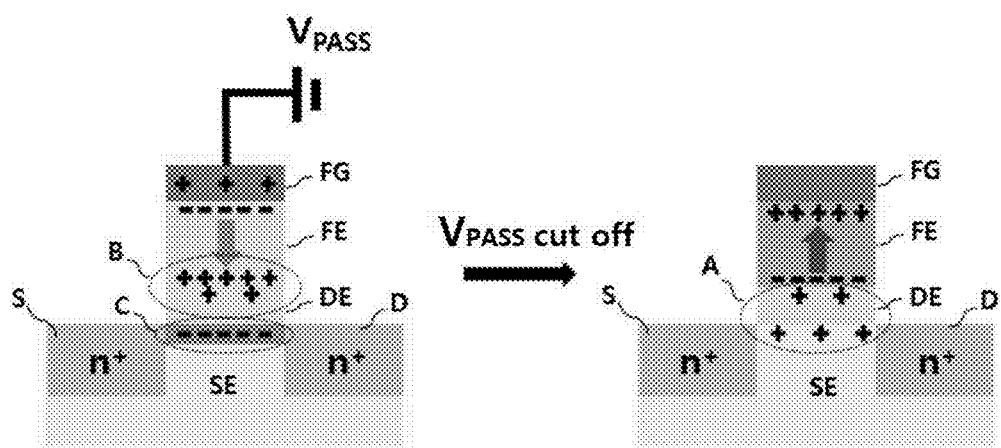
FIG. 7B is a diagram for explaining the turn-on operation of unselected memory cells sharing a bit line with a selected memory cell in a ferroelectric memory array according to an embodiment of the present invention.
Figure 7C:
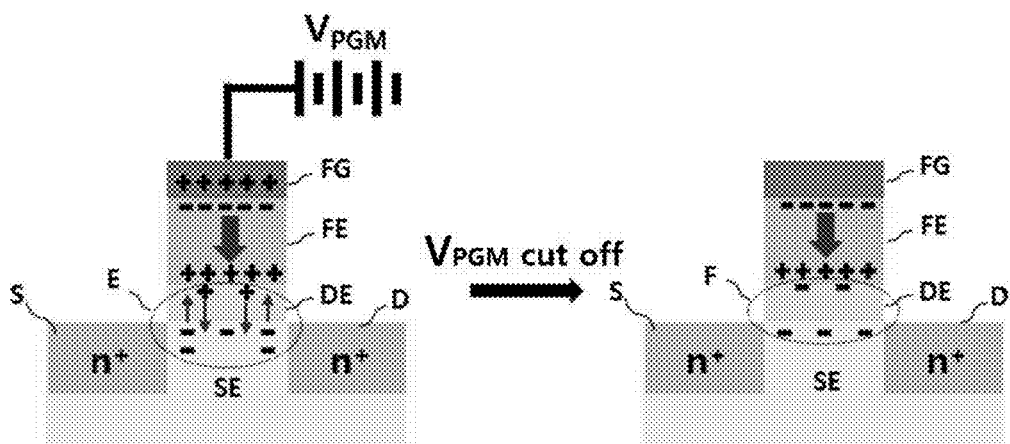
FIG. 7C is a diagram for explaining a programming operation of a memory cell in the ferroelectric memory array according to the embodiment of the present invention.
Figure 7D:
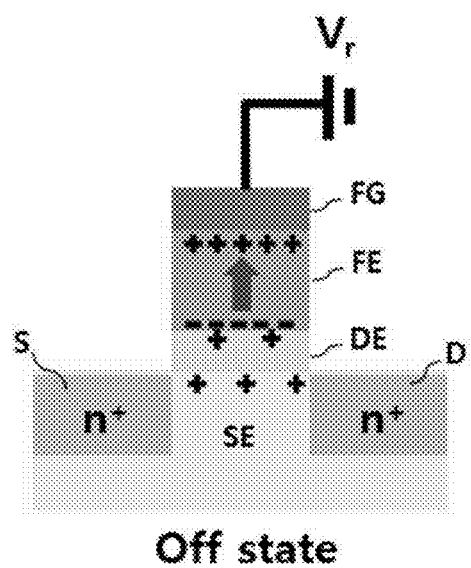
FIG. 7D and FIG. 7E are views for explaining the read operation of a memory cell in the ferroelectric memory array according to the embodiment of the present invention.
Figure 7E:
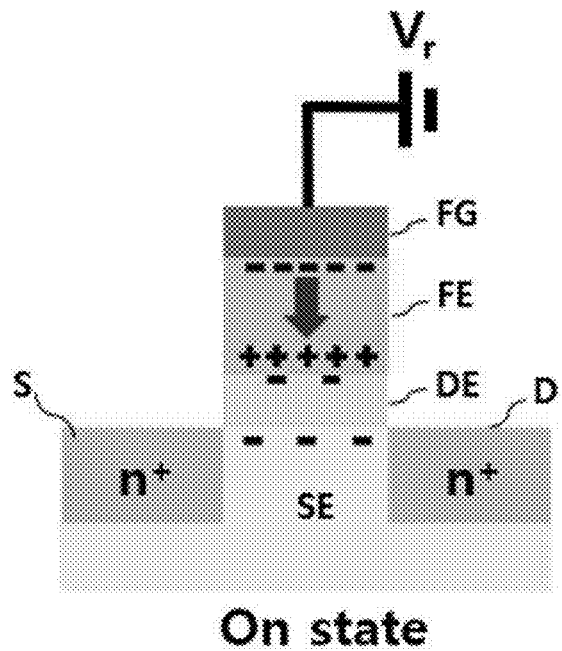

FIG. 7A is a diagram for explaining an erase operation of a memory cell in a ferroelectric memory array according to an embodiment of the present invention. FIG. 7B is a diagram for explaining the turn-on operation of unselected memory cells sharing a bit line with a selected memory cell in a ferroelectric memory array according to an embodiment of the present invention. FIG. 7C is a diagram for explaining a programming operation of a memory cell in the ferroelectric memory array according to the embodiment of the present invention, and FIG. 7D and FIG. 7E are views for explaining the read operation of a memory cell in the ferroelectric memory array according to the embodiment of the present invention. Here, the memory cell has a transfer characteristic of a hysteresis Id–Vg curve (FIG. 6) of SS value of 50 mV/dec, and the gate structure of the memory cell is a laminated structure consisting of a ferroelectric layer FE/a para-dielectric layer DE/a semiconductor layer SE.

Referring to FIG. 7A, when the negative erase voltage VERS is applied through the gate electrode FG, positive charges are generated on the first junction surface of the ferroelectric layer (for example, the surface where the gate electrode FG and the ferroelectric layer FE are contacting with each other) due to the negative charges of the gate electrode FG. Negative charges are generated on the second junction surface (the surface where the ferroelectric layer FE and the phase-change layer DE are contacting with each other) that is opposite to the first junction surface of the ferroelectric layer FE. Therefore, the ferroelectric layer FE has a positive polarization state. According to the present invention, the positive polarization direction of the ferroelectric layer FE may refer to a direction oriented from the second junction surface to the first junction surface.

Further, when a negative erase voltage VERS is applied, holes (+) may be formed in the channel between the source region S and the drain region D, but this leads to a depolarization effect of the ferroelectric layer FE, and thereby an unstable state may be generated. The holes (+) of a channel may move to the interface between the ferroelectric layer FE and the para-dielectric layer DE, as shown in the area A, in order to maintain the stabilization in the erase state. Although some of the holes of the channel move to the interface between the ferroelectric layer FE and the para-dielectric layer DE, the memory cell may be maintained as an off state by some remaining holes of the channel.

After the erase operation of FIG. 7A, a program operation may be performed on the memory cell, as shown in FIG. 7C, and then a read operation may be performed on the memory cell in the erase state or program state, as shown in FIG. 7D or FIG. 7E. As described above, in the read operation of the selected memory cell, the operation of applying the pass voltage to the unselected memory cell sharing the bit line and the selected memory cell may be performed as shown in FIG. 7B.

Referring FIG. 7B, when the pass voltage Vpass is applied through the gate electrode FG of the unselected memory cell having the positive polarization state, the positive polarization state of the ferroelectric layer FE of the unselected memory cell may be inverted to a negative polarization state. According to the present invention, the negative polarization direction of the ferroelectric layer FE may refer to a direction oriented from the first junction surface to the second junction surface. The pass voltage Vpass is less than the program voltage PGM but is maintained within the negative capacitance operating condition, so that the pass voltage Vpass, which changes a polarization state of the ferroelectric layer FE into the negative polarity state, may be higher than the first threshold value Vth1.

In this case, when the channel is turned on and a sufficient current C is supplied, the unselected memory cell may not interfere with the read operation of the selected memory cell. However, since the polarization state for data storage is inverted, there is a chance that data destruction may be generated. According to the present invention, such data destruction may be suppressed by stabilizing the inverted polarization. Specifically, when the pass voltage Vpass is removed, the inverted polarization of the ferroelectric layer FE, in the region B, may induce a strong depolarization effect due to the positive charge (+) disposed on the first junction surface of the ferroelectric FE and previously maintained interfacial positive charge (+). Therefore, when the pass voltage Vpass is removed, the inverted polarization of the ferroelectric layer FE may be restored to the previous polarization because of this strong depolarizing effect. For example, since the negative polarization state in the ferroelectric layer FE is restored to the positive polarization state, the data may be maintained without being destroyed even after the pass voltage Vpass is applied. That is, as long as the interfacial charge between the para-dielectric layer DE/the semiconductor layer SE is maintained during application period of the pass voltage Vpass, the electric field across the para-dielectric layer DE may be significantly increased. This effect is possible since the charge exchange time between the interface between the ferroelectric layer FE through the para-dielectric layer DE, and the channels para-dielectric layer DE; and a channel are longer than the read time. If the charge exchange time is shorter than the read time, the interface charge between the para-dielectric layer DE and the semiconductor layer SE may not be maintained or the first polarization state in the ferroelectric layer (FE), may not be restored to the second polarization state.

Referring to FIG. 7C, when a program voltage $V_{PGM}$ higher than the pass voltage Vpass is applied through the gate electrode FG of the selected memory cell, the negative charges are generated on the first junction plane of the layer FE (e.g., the surface where the gate electrode FG and the ferroelectric layer FE are contacting with each other) because of the positive charges of the gate electrode FG. Further, since the positive charge is generated on the second junction surface (the surface where the ferroelectric layer FE and the para-dielectric layer DE are contacting with each other) facing the first junction surface of the ferroelectric layer FE. Therefore, the ferroelectric layer FE has a negative polarization state, which may refer to a program state. This means that since the program voltage $V_{PGM}$ is much higher than the pass voltage Vpass, the electric field at both ends of the para-dielectric layer DE is sufficiently high to induce a charge exchange through a tunneling process, and the negative polarization state may be stabilized. Also, since the program time is generally much longer than the read time (about several tens of microseconds (μs)), a sufficient charge exchange may occur for polarization inversion (both program and erase operations). This may occur based on the tunnel switch effect of a ferroelectric layer FE/a para-dielectric layer DE structure. Therefore, the reversible exchange between the erase state and the program state may be realized using the tunnel switch effect.

Referring to FIG. 7D, when the read voltage Vread is applied through the gate electrode FG of the selected memory cell having the erase state, the selected memory cell may be read as the off-state in which the flow of current is disturbed due to the positive polarization of the ferroelectric layer FE formed by the erase voltage.

Referring to FIG. 7E, when the read voltage Vread is applied through the gate electrode FG of the selected memory cell having the programmed state, the selected memory cell may be read as an on state in which current flow is improved due to the negative polarization of the ferroelectric layer FE formed by the program voltage.

Referring to FIG. 7A to FIG. 7E, in connection with a memory cell, an exemplary case is described wherein the para-dielectric layer DE is disposed between the ferroelectric layer FE and the semiconductor active layer SE, and the charge trap site CTS is formed at an interface between the semiconductor active layer SE and the para-dielectric layer DE. But, as shown in FIG. 8A to 8E, the memory cell may be formed such that the para-dielectric layer DE is disposed between the gate electrode FG and the ferroelectric layer FE, so that the charge trap site CTS may be formed at the interface between the ferroelectric layer FE and the para-dielectric layer DE. In another embodiment, the memory cell has a structure in which the first para-dielectric layer DE is disposed between the ferroelectric layer FE and the semiconductor active layer SE, and the second para-dielectric layer DE is disposed between the gate electrode FG and the ferroelectric layer FE. Therefore, the charge trap sites CTS may be formed at the interface between the semiconductor active layer SE and the first phase insulating layer DE and at the interface between the ferroelectric layer FE and the para-dielectric layer DE.

Figure 8A:
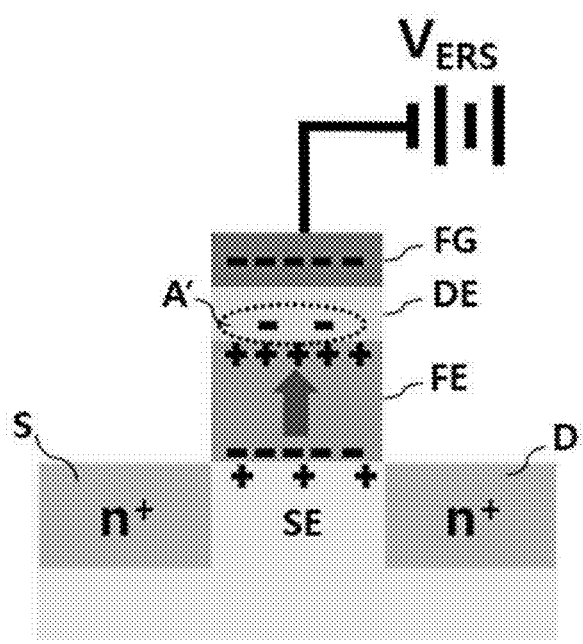
FIG. 8A is a diagram for explaining an erase operation of a memory cell in a ferroelectric memory array according to another embodiment of the present invention.
Figure 8B:
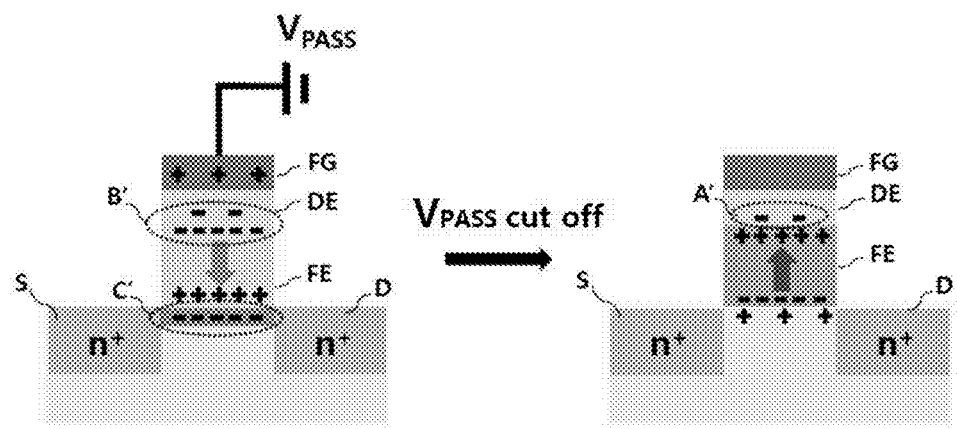
FIG. 8B is a diagram for explaining a turn-on operation of unselected memory cells sharing a bit line and a selected memory cell in a ferroelectric memory array according to another embodiment of the present invention.
Figure 8C:
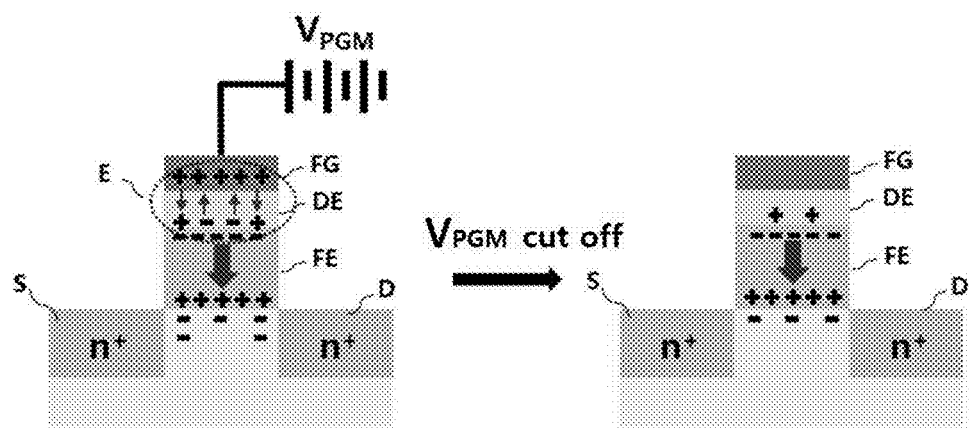
FIG. 8C is a diagram for explaining programming operation of a memory cell in a ferroelectric memory array according to another embodiment of the present invention.
Figure 8D:
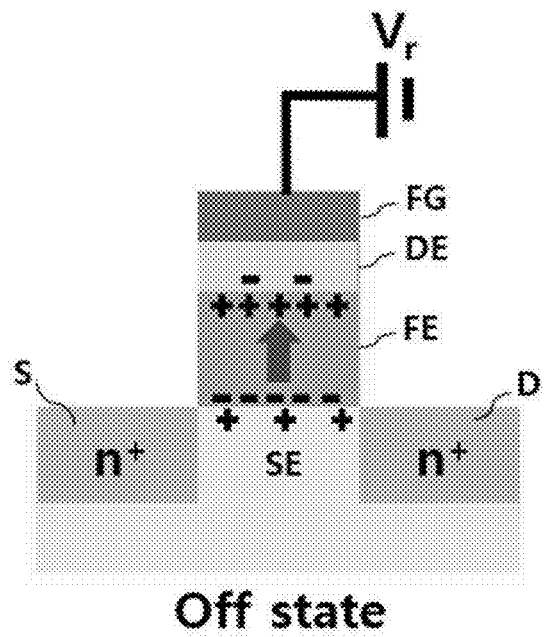
FIG. 8D and FIG. 8E are diagrams for explaining a read operation of a memory cell in a ferroelectric memory array according to another embodiment of the present invention.
Figure 8E:
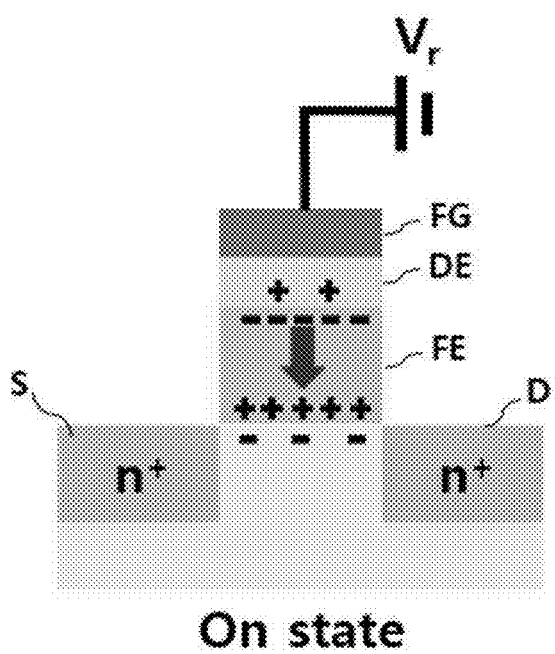

FIG. 8A is a diagram for explaining an erase operation of a memory cell in a ferroelectric memory array according to another embodiment of the present invention. FIG. 8B is a diagram for explaining a turn-on operation of unselected memory cells sharing a bit line and a selected memory cell in a ferroelectric memory array according to another embodiment of the present invention. FIG. 8C is a diagram for explaining programming operation of a memory cell in a ferroelectric memory array according to another embodiment of the present invention. FIG. 8D and FIG. 8E are diagrams for explaining a read operation of a memory cell in a ferroelectric memory array according to another embodiment of the present invention.

Referring to FIG. 8A, when a negative erase voltage VERS is applied, if the fact that the positive polarization is generated in the ferroelectric layer FE is not contradictory, it is possible to refer to FIG. 7A. Only, in case of FIG. 7A, at least the holes (+) in the channel move to the interface between the ferroelectric layer FE and the para-dielectric layer DE and are trapped at the interface. However, in the case of FIG. 8A, the electrons (−) may migrate to the interface between the ferroelectric layer (FE) and the para-dielectric layer DE and may be trapped at the interface, like A'. Similar to FIG. 7A, the memory cells may be maintained as an off state by the holes of the channel.

Referring to FIG. 8B, when the pass voltage Vpass is applied through the gate electrode FG of the unselected memory cell having the positive polarization state, if the fact that the positive polarization state of the ferroelectric layer FE of the unselected memory cell is inversed to the negative polarization state is not contradictory, it is possible to refer to FIG. 7B.

Similar to FIG. 7B, in this case, the channel is turned on and a sufficient current C is supplied so that the unselected memory cell may not interfere with the read operation of the selected memory cell, but since the polarization state for data storage is inverted, data destruction may be generated. According to the present invention, such data destruction may be suppressed by stabilizing the inverted polarization. Specifically, when the pass voltage Vpass is removed, in the B' region, the inversed polarization of the ferroelectric layer FE may induce strong depolarization effect by using the negative charge (−) disposed on the second junction surface of the ferroelectric FE and the previously maintained interface negative charge (−). Therefore, when the pass voltage Vpass is removed, the inverted polarization of the ferroelectric layer FE may be restored to the previous polarization due to this strong depolarizing effect. For example, since the negative polarization state in the ferroelectric layer FE is restored to the positive polarization state, the data may be maintained without being destroyed even after the pass voltage Vpass is applied. That is, as long as the interfacial charge between the para-dielectric layer DE/the ferroelectric layer (FE) is maintained during the application period of the pass voltage Vpass, the electric field across the entire para-dielectric layer DE may be significantly increased because of the external voltage and the interface charge effect.

The program operation applied by the program voltage $V_{PGM}$ higher than the pass voltage Vpass through the gate electrode FG of the selected memory cell shown in FIG. 8C may refer to FIG. 7C if there are no contradictions. The contents of the read operation of FIG. 8E may refer to FIG. 7D and FIG. 7E if there are no contradictions.

FIG. 9 is a diagram showing hysteresis $I_d$-$V_g$ curves of a memory cell in a NAND ferroelectric memory array according to another embodiment of the present invention. FIG. 9 shows a hysteresis $I_d$-$V_g$ curve when the SS value of the memory cell is 60 mV/dec or more, preferably 200 mV/dec. The SS value may be secured to about 200 mV/dec by increasing the thickness of the para-dielectric layer DE or significantly dispersing the coercive voltage Vc of the polycrystalline ferroelectric layer FE.

If the description of the transfer characteristics of the memory cell based on the hysteresis $I_d$-$V_g$ curve of FIG. 9 is not contradictory, it may refer to the explanation related to the transfer characteristics of the memory cell based on $I_d$-$V_g$ curve based on the hysteresis Id-Vg curve described in FIG. 6.

However, when the SS value of the memory cell of 200 mV/dec which is larger than the SS value of the memory cell of FIGS. 6A to 6B is used, the turn-on mechanism of the memory cell may be different. Specifically, in the case of FIGS. 6A and 6B, the polarization of the ferroelectric layer FE may be inversed to turn on the memory cell, and then the memory cell may be operated with a mechanism that returns to the previous polarization state due to a negative capacitance effect. On the other hand, in the case of FIG. 9, the memory cell may operate as a mechanism for turning on a memory cell without reversing the polarization of the ferroelectric layer FE through a small number of inverse domain regions among the plurality of domain regions that determine a polarization state or a polarization direction in the ferroelectric layer FE.

When the domain region has a positive polarization, the inverse domain region has a negative polarization, and conversely, if the domain region has a negative polarization, the inverse domain region may have a positive polarization.

If the SS value is large, a program voltage VPGM higher than the program voltage PGM of FIG. 6 may be needed as a parameter of the memory cell operation in order to ensure switching of sufficient ferroelectric layer polarization within a reasonable program time. For example, the program voltage $V_{PN}$ may be approximately 15 volts. Further, the gate voltage Vg corresponding to the coercive voltage Vc of the ferroelectric layer may be 8V. In this case, the pass voltage Vpass may be set to a value higher than 8 V which interferes with the erase data of the unselected memory cell. Thus, the pass voltage Vpass may be set to a value lower than 8 V, for example, about 7 V which may not turn on the unselected memory cell completely in the erase operation. However, referring to the enlarged region of the Id–Vg curve in the low Vg region, the off state (ERS) current (Ioffrp) at the pass voltage Vpass may be higher than the read current of the memory cell when the read voltage Vr is set to a sufficiently low 2V. If the unselected memory cell is in the on state PGM, the current Ionrp must be higher than the current Ioffrp, so that the read operation of the selected memory cell may not be disturbed. When the read current Ionr and Ioffr of the selected memory cell (e.g., Vr1) is lower than Ioffpass, the read current margin may be Ionr−Ioffr, and the margin value may not be sufficiently large. Due to the nonlinearity of the Id–Vg curve, an increase in Vr2 may increase the read current margin. However, if Vr increases to a value higher than Ioffpass, it becomes the read current margin Ioffpass−Ioffr, and the read current margin value may become 0 (zero) as Vr approaches Vpass. At this time, Vpass should be as high as possible (still lower than VPGM), but this may cause disturbance of erase data of unselected memory cells due to partial switching of the ferroelectric layer FE.

In another embodiment, as shown in FIG. 9 which is similar to FIG. 6, under a state that the first threshold value Vth1 is set as a threshold value for turning on the memory cells in the programmed state, and a second threshold value Vth2 lower than the first threshold value Vth1 is set as a threshold for turning off the memory cell in an erase state, a driving step may be started.

Figure 10A:
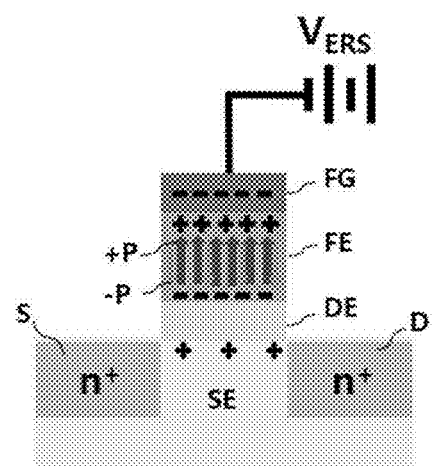
FIG. 10A is a diagram for explaining an erase operation of a memory cell in a ferroelectric memory array according to another embodiment of the present invention.
Figure 10B:
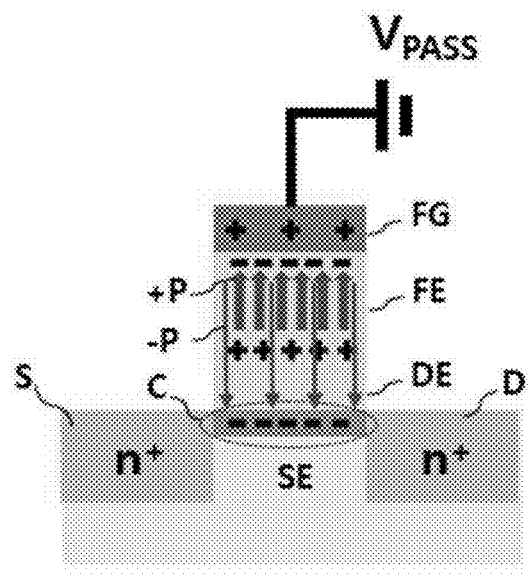
FIG. 10B is a diagram for explaining a turn-on operation of an unselected memory cell sharing a bit line and a selected memory cell in a ferroelectric memory array according to another embodiment of the present invention.
Figure 10C:
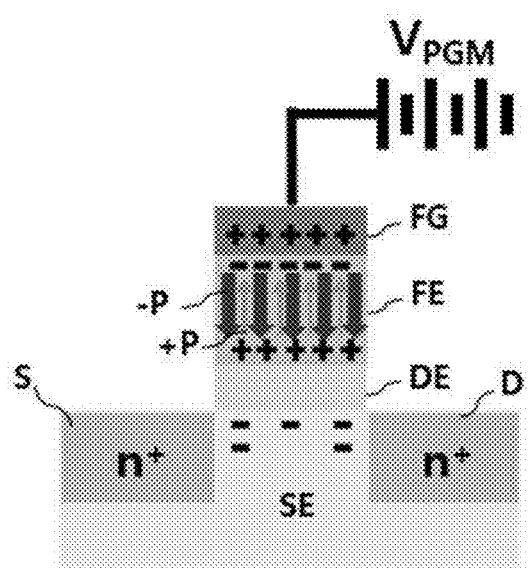
FIG. 10C is a diagram for explaining programming operation of a memory cell in a ferroelectric memory array according to another embodiment of the present invention.
Figure 10D:
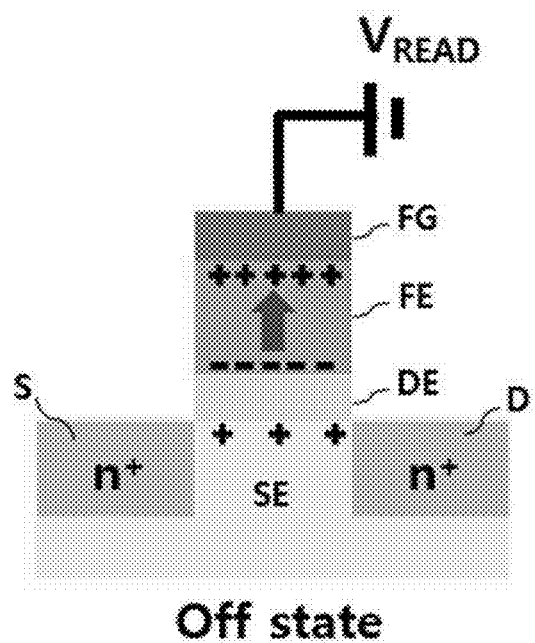
FIGS. 10D and 10E are diagrams for explaining a read operation of a memory cell in the ferroelectric memory array according to still another embodiment of the present invention.
Figure 10E:
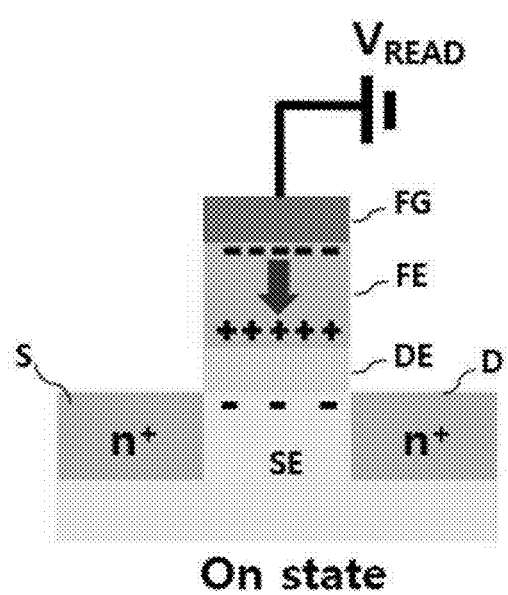

FIG. 10A is a diagram for explaining an erase operation of a memory cell in a ferroelectric memory array according to still another embodiment of the present invention. FIG. 10B is a diagram for explaining a turn-on operation of an unselected memory cell sharing a bit line and a selected memory cell in a ferroelectric memory array according to another embodiment of the present invention. FIG. 10C is a diagram for explaining programming operation of a memory cell in a ferroelectric memory array according to another embodiment of the present invention, and FIGS. 10D and 10E are diagrams for explaining a read operation of a memory cell in the ferroelectric memory array according to still another embodiment of the present invention.

Referring to FIG. 10A, when a negative erase voltage VERS is applied, if the fact that the positive polarization is formed in the ferroelectric layer FE is not contradictory, it is possible to refer to FIG. 7. However, in the case of FIG. 7A, only the positive polarization (+P) is indicated by a plurality of domain regions in the ferroelectric layer FE. In FIG. 10A, a polarization state may be defined by a plurality of domain regions and a small number of inverse domain regions in the erase state. Specifically, the plurality of domain regions refers to a positive polarization (+P), and a small number of inverse domain regions may refer to a negative polarization (+P).

Referring FIG. 10B, when the pass voltage Vpass is applied through the gate electrode FG of the unselected memory cell having the positive polarization state, polarization of the ferroelectric layer FE of the unselected memory cell is not inversed unlike FIG. 8B. However, current may flow through the channel of the semiconductor active layer SE due to the negative polarization (+P) of the small number of inverse domain regions. Specifically, polarization of the ferroelectric layer FE is not inversed, and the unselected memory cell may be turned on.

Referring to FIG. 10C, when a program voltage VPGM higher than the pass voltage Vpass is applied through the gate electrode FG of the selected memory cell, the negative charges are generated on the first junction surface of the ferroelectric layer FE (e.g., the surface where the gate electrode FG and the ferroelectric layer FE are contacting with each other). Further, the positive electric charges are generated on the second junction surface (the surface where the ferroelectric layer FE and the para-dielectric layer DE are contacting with each other), which face the first junction surface of the ferroelectric layer FE, which may refer to a program state. At this time, similarly to the erase state in FIG. 10A, the polarization state of the ferroelectric layer FE may be classified into a plurality of domain regions and a few inverse domain regions. To be more specific, the plurality of domain regions may refer to a negative polarization (–P), and a few inverse domain regions may refer to a negative polarization (–P). In addition, in connection with the explanation of the reading operation of FIG. 10D and FIG. 10E, it is possible to refer to FIG. 7D and FIG. 7E if there are no contradictory points.

Figure 11:
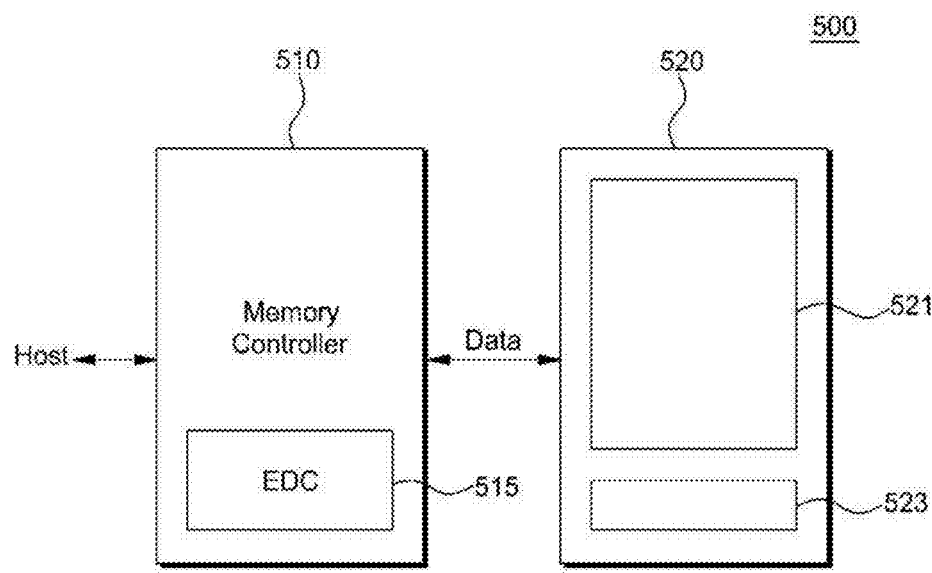
FIG. 11 is a block diagram illustrating a memory system in accordance with one embodiment of the present invention.

FIG. 11 is a block diagram illustrating a memory system 500 in accordance with one embodiment of the present invention.

Referring to FIG. 11, the memory system 500 includes a memory controller 510 and a non-volatile memory device 520. The memory controller 510 may perform an error correction code for the non-volatile memory device 520. The memory controller 510 may control the non-volatile memory device 520 by referring to an instruction and an address from the outside.

When the memory controller 510 receives the write request from the host, the memory controller 510 may perform error correction encoding on the data for which write is requested. In addition, the memory controller 510 may control the non-volatile memory device 520 in order to program the encoded data into a memory area corresponding to the provided address. In addition, the memory controller 510 may perform error correction decoding on the data output from the non-volatile memory 520 during a read operation. The error included in the output data may be corrected via the error correction decoding. To perform the detection and correction of the error, the memory controller 510 may include an error correction block 515.

The non-volatile memory device 520 may include a memory cell array 521 and a page buffer 523. The memory cell array 521 may comprise a single level memory cell or an array of two or more bits of multilevel memory cells. Upon receiving the initialization request, the memory controller 510 may initialize the string selection transistors of each memory layer to have a predetermined state by a program or erase method using a time-varying erase voltage signal according to the above-described embodiments.

Figure 12:
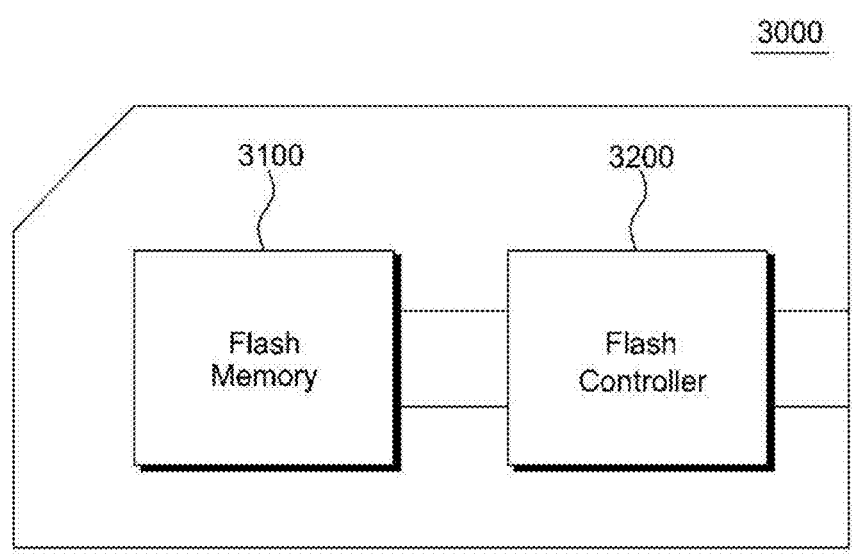
FIG. 12 is a block diagram illustrating a data storage device according to another embodiment of the present invention.

FIG. 12 is a block diagram illustrating a data storage device 3000 according to another embodiment of the present invention.

Referring to FIG. 12, a data storage device 3000 according to the present invention may include a non-volatile ferroelectric memory device 3100 and a flash controller 3200. Flash controller 3200 may control non-volatile ferroelectric memory device 3100 based on control signals received from external circuits of data storage device 3000. The three-dimensional memory array structure of the non-volatile ferroelectric memory device 3100 may be, for example, a channel stacked structure, a straight BICs structure (straight-shaped Bit Cost Scalable structure), and a pipe-shaped BICs (pipe-shaped Bit Cost Scalable), and the above structure is only illustrative, and the present invention is not limited thereto.

The data storage device 3000 of the present invention may constitute a memory card device, an SSD device, a multimedia card device, an SD card, a memory stick device, a hard disk drive device, a hybrid drive device, or a universal serial bus flash device. For example, the data storage device 3000 of the present invention may be a memory card that meets the standard or specification for using an electronic device such as a digital camera, or a personal computer.

Figure 13:
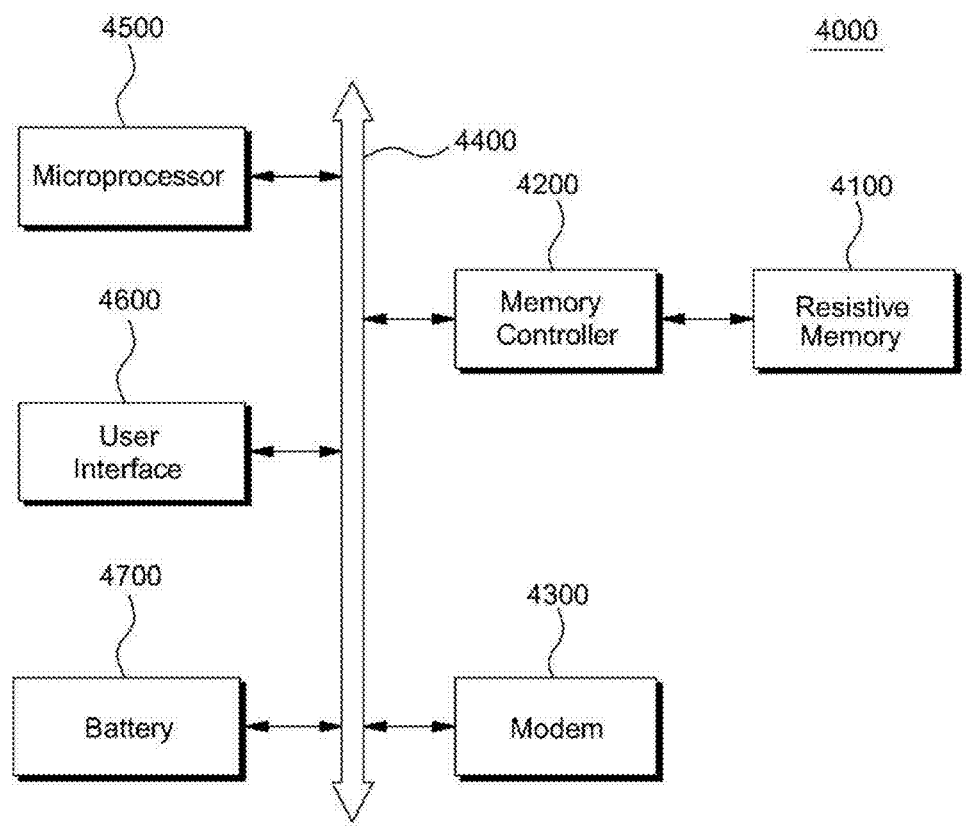
FIG. 13 is a block diagram of a flash memory device and a computing system including the same according to an embodiment of the present invention.

FIG. 13 is a block diagram illustrating a non-volatile ferroelectric memory device 4100 and a computing system 4000 including the same according to an embodiment of the present invention.

Referring to FIG. 13, a computing system 4000 in accordance with the present invention may include a non-volatile ferroelectric memory device 4100 electrically connected to a bus 4400, a memory controller 4200, a modem 4300 such as a baseband chipset, a microprocessor 4500, and a user interface 4600.

The non-volatile ferroelectric memory 4100 shown in FIG. 13 may be the non-volatile memory element described above. The computing system 4000 according to the present invention may be a mobile computing system. In this case, a battery 4700 for supplying the operating voltage of the computing system 4000 may further be provided. Although not shown, an application chipset, a camera image processor CIS, or a mobile DRAM may be further provided in the computing system according to the present invention. The memory controller 4200 and the non-volatile ferroelectric memory 4100 may constitute, for example, a solid-state drive disk SSD using a non-volatile ferroelectric memory element for storing data.

The non-volatile memory device and/or memory controller according to the present invention may be implemented using various types of packages. For example, the non-volatile ferroelectric memory device and/or memory controller according to the present invention may be implemented by using the packages such as PoP (Package on Package), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SiP), Multi Chip Package (MCP), Wafer-level Fabricated Package (WFP), or Wafer-Level Processed Stack Package (WSP).

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A non-volatile ferroelectric memory device including a semiconductor active layer, a plurality of memory cells connected in series on the semiconductor active layer, and a control circuit for performing a read operation and a program operation on the selected memory cell among the plurality of memory cells, each of the memory cells comprising:
   a para-dielectric layer on the semiconductor active layer;
   a dielectric stack including a ferroelectric layer stacked on the para-dielectric layer and a charge trap site for generating a negative capacitance effect of the ferroelectric layer by charges disposed and trapped at an interface between the ferroelectric layer and the para-dielectric layer; and
   a control gate electrode on the ferroelectric layer.

2. The non-volatile ferroelectric memory device of claim 1, wherein the subthreshold swing SS value of the memory cell is less than 60 nmV/dec.

3. The non-volatile ferroelectric memory device of claim 1, wherein the control circuit allocates any one of an erase state or a program state in response to each of two polarities of charges trapped in the charge trap site.

4. The non-volatile ferroelectric memory device of claim 1, wherein the control circuit inverts a polarization in the ferroelectric layer of the unselected memory cell in order to turn on at least one unselected memory cell sharing a bit line with the selected memory cell during a read operation for the selected memory cell, and the charges in the charge trap sites of the unselected memory cells maintain a trap.

5. The non-volatile ferroelectric memory device of claim 4, wherein depolarization phenomenon of the ferroelectric layer is induced by the electric charges trapped in the charge trap site and the inverted polarization of the ferroelectric layer.

6. The non-volatile ferroelectric memory device of claim 5, wherein the control circuit is operable to make the charges within the charge trap site be maintained upon completion of a read operation with respect to the selected memory cell and is operable to control the inverted polarization in the ferroelectric layer to restore to the previous polarization by using a depolarization phenomenon of the ferroelectric layer.

7. The non-volatile ferroelectric memory device of claim 3, wherein the control circuit inverts the polarization in the ferroelectric layer of the selected memory cell during program operation for the selected memory cell, moves the charges in the charge trap site of the selected memory cell to the channel of the semiconductor active layer of the selected memory cell, and makes other charges in the channel of the semiconductor active layer of the selected memory cell be trapped into the charge trap site.

8. The non-volatile ferroelectric memory device of claim 1,
   wherein the transfer characteristic of the memory cell is represented by a first voltage-current curve and a second voltage-current curve in a programmed state,
   wherein the control circuit is configured to apply a read voltage to the control gate electrode of the selected memory cell during the read operation, and to apply a pass voltage to a control gate electrode of at least one unselected memory cell sharing a bit line and the selected memory cell,
   wherein the read voltage is determined as a voltage between a first threshold voltage defined from the first voltage-current curve; and a second threshold voltage which is defined from the second voltage-current curve and is lower than the first threshold voltage, and the pass voltage is determined as a voltage in an overlap region in which the second current-voltage curve overlaps.

9. The non-volatile ferroelectric memory device of claim 8,
   wherein the control circuit applies a program voltage to the control gate electrode of the selected memory cell during the program operation,
   wherein the program voltage is determined as a voltage higher than the pass voltage in the overlap region.

10. The non-volatile ferroelectric memory device of claim 1, wherein the ferroelectric layer includes an oxide ferroelectric, a fluoride ferroelectric, a ferroelectric semiconductor, a polymeric ferroelectric, or a mixture thereof.

11. The non-volatile ferroelectric memory device of claim 1, wherein the para-dielectric layer and the ferroelectric layer have the same crystal structure.

12. The non-volatile ferroelectric memory device of claim 11, wherein the crystal structure is a perovskite structure, a fluorite structure, or a layered structure.

13. The non-volatile ferroelectric memory device of claim 1, wherein a charge exchange time between the charge trap site and the channel of the semiconductor active layer through the para-dielectric layer is longer than a reading time of the read operation.

14. The non-volatile ferroelectric memory device of claim 1, wherein the thickness of the ferroelectric layer is in the range of 1 nm to 100 nm.

15. The non-volatile ferroelectric memory device of claim 1, wherein the thickness of the para-dielectric layer is in the range of 1 nm to 100 nm.

16. A method for driving a non-volatile ferroelectric memory device including a plurality of memory cells having a para-dielectric layer on a semiconductor active layer, a ferroelectric layer stacked on the para-dielectric layer, a dielectric stack having a charge trap site that generates a negative capacitance effect of the ferroelectric layer by the charge trapped and disposed at an interface between the para-dielectric layer and the ferroelectric layer, and a control gate electrode on the ferroelectric layer comprising,
   a step for selecting one memory cell of the plurality of memory cells;
   a step for controlling the charge in the charge trap site of at least one unselected memory cell sharing the bit line and the selected memory cell to maintain a trap; and
   a step for inverting polarization in the ferroelectric layer of the unselected memory cell to turn on the unselected memory cell.

17. The method for driving a non-volatile ferroelectric memory device of claim 16, further comprising a step for inducing a depolarization phenomenon of the ferroelectric layer by using the charges trapped in the charge trap site, and the inverted polarization of the ferroelectric layer.

18. The method for driving a non-volatile ferroelectric memory device of claim 17, further comprising a step for maintaining the charges in the charge trap site maintain the trap and for restoring the inverted polarization in the ferroelectric layer to a previous polarization using a depolarization phenomenon induced in the ferroelectric layer.

19. The method for driving a non-volatile ferroelectric memory device of claim 16, further comprising:
   a step for inverting polarization in the ferroelectric layer of the selected memory cell; and
   a tunnel switch step for moving charges in the charge trap site of the selected memory cell to channels of the semiconductor active layer of the selected memory cell, and for trapping other charges in the channel of the semiconductor active layer of the selected memory cell into the charge trap site.

* * * * *